(12) United States Patent
Ryu et al.

(10) Patent No.: US 9,595,590 B2
(45) Date of Patent: Mar. 14, 2017

(54) SEMICONDUCTOR DEVICE AND METHOD FOR MANUFACTURING THE SAME

(71) Applicant: MagnaChip Semiconductor, Ltd., Cheongju-si (KR)

(72) Inventors: Yu Shin Ryu, Daejeon-si (KR); Bo Seok Oh, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/230,456

(22) Filed: Mar. 31, 2014

(65) Prior Publication Data

US 2015/0102405 A1    Apr. 16, 2015

(30) Foreign Application Priority Data

Oct. 10, 2013    (KR) .................. 10-2013-0120811

(51) Int. Cl.
| | | |
|---|---|---|
| *H01L 29/78* | (2006.01) | |
| *H01L 29/423* | (2006.01) | |
| *H01L 29/66* | (2006.01) | |
| *H01L 29/10* | (2006.01) | |

(52) U.S. Cl.
CPC .. *H01L 29/42368* (2013.01); *H01L 29/66659* (2013.01); *H01L 29/7835* (2013.01); *H01L 29/1087* (2013.01); *H01L 29/1095* (2013.01); *H01L 29/665* (2013.01)

(58) Field of Classification Search
USPC .................................................. 257/333–346
See application file for complete search history.

(56) References Cited

U.S. PATENT DOCUMENTS

| | | | | |
|---|---|---|---|---|
| 6,117,738 | A  * | 9/2000 | Tung ........................... 438/286 |
| 6,492,678 | B1 | 12/2002 | Hebert | |
| 6,888,205 | B2 * | 5/2005 | Moscatelli et al. .......... 257/406 |
| 7,374,982 | B2 | 5/2008 | Hebert | |
| 7,977,715 | B2 | 7/2011 | Cai | |
| 8,080,845 | B2 * | 12/2011 | Shima ......................... 257/336 |
| 2007/0235779 | A1 * | 10/2007 | Dietz ................ H01L 29/42368 257/288 |
| 2009/0194785 | A1 * | 8/2009 | Lu ....................... H01L 29/1095 257/139 |
| 2010/0181618 | A1 * | 7/2010 | Meunier-Bellard et al. . 257/344 |
| 2011/0039378 | A1 * | 2/2011 | Voldman ........... H01L 29/66659 438/200 |
| 2013/0020632 | A1 * | 1/2013 | Disney ................. H01L 29/402 257/328 |
| 2013/0181287 | A1 * | 7/2013 | Zhang ............... H01L 21/26506 257/335 |

* cited by examiner

*Primary Examiner* — Ali Naraghi
(74) *Attorney, Agent, or Firm* — NSIP Law

(57) ABSTRACT

A semiconductor device and a method for manufacturing the same are provided. The semiconductor device includes a well region, a drain region and a source region disposed in the well region, a gate electrode disposed above the well region, a thin gate insulating layer and a thick gate insulating layer disposed under the gate electrode, the thick gate insulating layer being disclosed closer to the drain region than the thin gate insulating layer, and an extended drain junction region disposed below the gate electrode.

25 Claims, 20 Drawing Sheets

SEMICONDUCTOR DEVICE AND METHOD FOR MANUFACTURING THE SAME

CROSS-REFERENCE TO RELATED APPLICATIONS

This application claims the benefit under 35 USC 119(a) of Korean Patent Application No. 10-2013-0120811 filed on Oct. 10, 2013, in the Korean Intellectual Property Office, the entire disclosure of which is incorporated herein by reference for all purpose.

BACKGROUND

1. Field

The following description relates to a semiconductor device and a method for manufacturing the same, and to, for example, a stepped gate insulating layer MOSFET semiconductor device used in a level shifter block of a display driver IC and a method for manufacturing the double diffused MOS (DMOS) semiconductor device.

2. Description of Related Art

An enhancement driver depletion load metal oxide semiconductor device is a device in which a gate electrode of a load is connected to an output terminal by forming a driver in an enhancement type arrangement and the load in a depletion type arrangement in an inverter gate of a metal-oxide-semiconductor field-effect transistor (MOSFET). Since a metal-oxide-semiconductor (MOS) transistor as the load has constant-current characteristics, the DMOS device is widely used in a logic circuit due to excellent operating characteristics.

A conventional DMOS device includes an individual high-voltage device (HV device) and/or an individual medium-voltage device (MV device) having a large size and a low drain current in order to convert a low voltage (LV) into a medium voltage (MV) or a high voltage (HV). However, owing to insufficient drain current, it is difficult to drive the medium-voltage device or the high-voltage device by using a low voltage gate input. Thus, when a finger type MOS device in which a width is increased is used, there is a problem in that a size of a chip is reduced to cause a bottleneck phenomenon.

Further, because channel length modulation is not good in a level shifter block, it is difficult to secure a stable driving power. That is, the medium-voltage device or the high-voltage device is used when a low-voltage input is increased to a medium-voltage output or a high-voltage output in the level shifter block, and when a low-voltage gate voltage input is applied, since the drain current is low and the channel length modulation is not good, it is difficult to secure the stable driving power.

Patent Literature 1: U.S. Pat. No. 6,492,678.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a well region, a drain region and a source region disposed in the well region, a gate electrode disposed above the well region, a thin gate insulating layer and a thick gate insulating layer disposed under the gate electrode, the thick gate insulating layer being disclosed closer to the drain region than the thin gate insulating layer, and an extended drain junction region disposed below the gate electrode.

The well region may be a first conductivity region, the drain region and the source region may be second conductivity regions, and the extended drain junction region may be a second conductivity region.

The extended drain junction region may extend laterally to a portion of the well region from the drain region.

A length of the extended drain junction region overlapping with the gate electrode may be greater than a length of the gate electrode overlapping with the thick gate insulating layer.

A difference between the length of the gate electrode overlapping with the thick gate insulating layer and the length of the extended drain junction region overlapping with the gate electrode may be equal to or less than 0.1 μm.

An upper surface of a semiconductor region between the gate insulating layer and the drain region may be coplanar.

The extended drain junction region may have a depth of 500 Å to 3500 Å.

The general aspect of the semiconductor device may further include an isolation layer having a depth deeper than the extended drain junction region.

The extended drain junction region may extend to a portion of the well region under the thin gate insulating layer.

The drain region may be formed in the extended drain junction region and may be isolated from the source region by the well region.

The extended drain junction region may extend to only a portion of the well region under the thick gate insulating layer.

A length of the gate electrode overlapping with the thick gate insulating layer may be shorter than a length of the extended drain junction region overlapping with the gate electrode.

The general aspect of the semiconductor device may further include a second conductive type medium well region between the extended drain junction region and the drain region.

The extended drain junction region may contact the well region.

In another general aspect, a method for manufacturing a semiconductor device involve: forming an extended drain junction region in a well region of a substrate, forming two or more gate insulating layers having different thicknesses on the well region, and forming a gate electrode on the gate insulating layers, in which the extended drain junction region overlaps with the gate electrode.

The general aspect of the method may further involve forming the well region in the substrate prior to forming the extended drain junction region, and forming a source region and a drain region on both sides of the gate electrode.

The gate insulating layers may include a first gate insulting layer and a second gate insulating layer, and the first gate insulating layer has a thickness thinner than the second gate insulating layer.

The first gate insulating layer may be formed closer to the source region than the second gate insulating layer.

The extended drain junction region may be formed through ion implantation for logic well voltage adjustment.

The extended drain junction region may have a dopant concentration of approximately 1 E17 atoms/cm$^3$ to 1 E19 atoms/cm$^3$.

The extended drain junction region may be formed to extend from the drain region to a portion under the first gate insulating layer.

The first gate insulating layer may have a thickness of 5 Å to 50 Å.

Other features and aspects will be apparent from the following detailed description, the drawings, and the claims.

Figure 1:
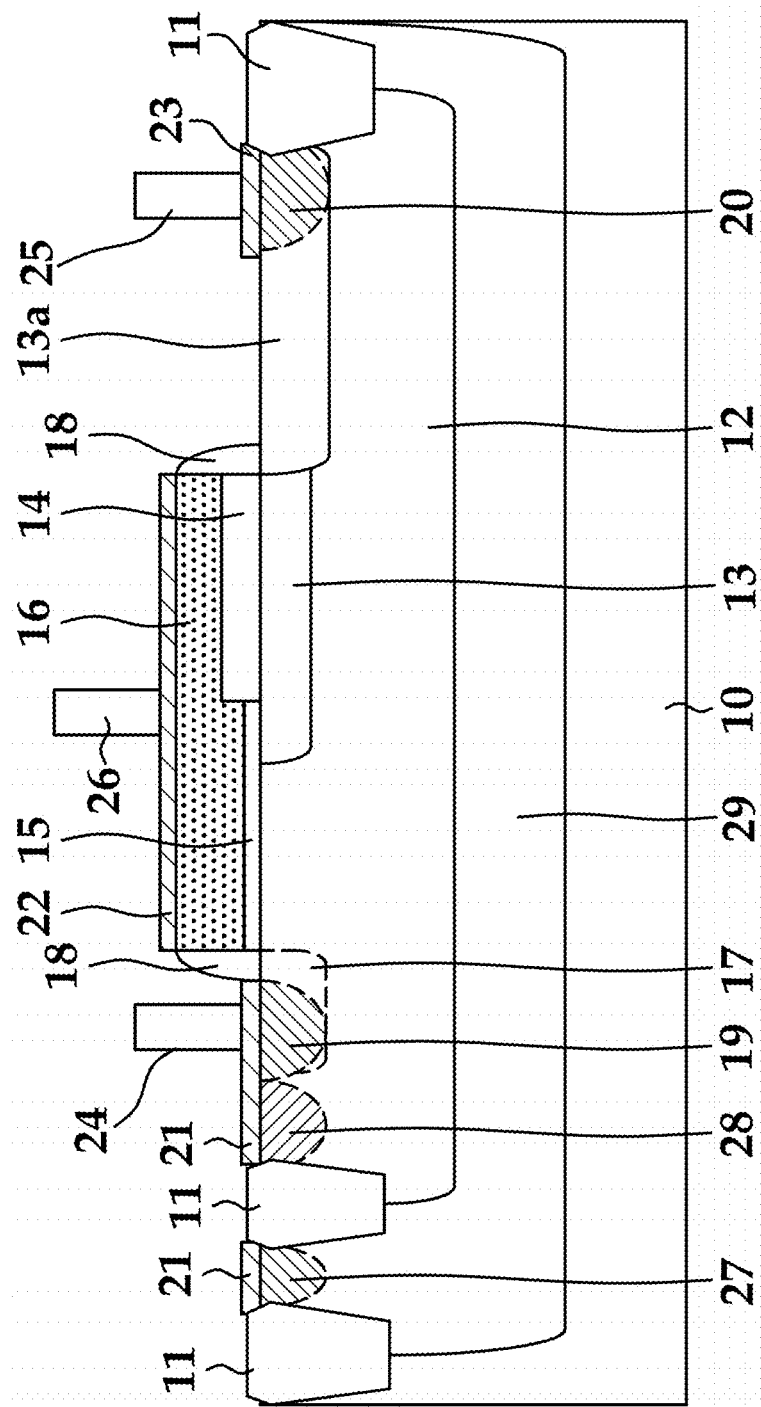
FIG. 1 illustrates a cross-sectional view of an example of a stepped gate insulating layer DMOS semiconductor device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

According to a general aspect, the present disclosure provides an example of a stepped gate insulating layer DMOS device and an example of a method for manufacturing the same with which it is possible to selectively operate the device as a LV, MV or HV device by forming a plurality of gate insulating layer regions having different heights and extending an extended drain junction region from a drain region to any one of the gate insulating layer regions to surround the entire region or a part of the region. As a result, it is possible to supply a high drain current, and a size of the DMOS device need not be increased to implement separate LV, MV and HV components.

The present disclosure also provides an example of a stepped gate insulating layer DMOS device and an example of a method for manufacturing the same with which it is possible to supply a high drain current ten times that in an existing medium-voltage device or high-voltage device even in a low-voltage gate input voltage, to increase drivability of a drain current for a gate voltage by using a stepped gate oxide layer obtained by combining a LV gate insulating layer and a MV gate insulting layer or combining the LV gate insulating layer and a HV gate insulating layer as a gate oxide layer on which a device is formed, and to reduce a chip size without increasing an isolation rule by optimizing a junction region to be suitable for a MV or HV process.

Further, an example device according to the present disclosure exhibits excellent channel length modulation in a low voltage gate input. Furthermore, in the device, it may be possible to achieve a stable circuit configuration and an region between a gate region and a drain region in a planar type. Accordingly, a LOCOS or thin trench (STI) need not be used between the gate region and drain region.

Moreover, the present device is applicable to a process using STI, MTI (Medium Trench Isolation), or DTI (Deep Trench Isolation) so as to have a desired depth for device isolation.

In addition, it is possible to operate the device as the LV device, a dual device as a combination of the LV device and the MV device, or a dual device as a combination of the LV device and the HV device by adjusting a length of an extended drain junction within a channel in which a stepped gate insulating layer is formed.

According to a general aspect, in a stepped gate insulating layer DMOS device and a method for manufacturing the same, the DMOS device may be selectively operated as a LV, MV or HV device by forming a plurality of gate insulating layer regions having different heights and extending an extended drain junction region from a drain region to any one of the gate insulating layer regions to surround the entire region or a part of the region. As a result, it is possible to supply a high drain current, and a size of the device may be minimized.

Hereinafter, various examples of semiconductor devices are described in reference to the accompanying drawings.

FIGS. 1 to 6 illustrate cross-sectional views and plan views of examples of stepped gate insulating layer DMOS semiconductor devices. In these examples, the DMOS device may be an n-channel lateral double-diffused metal oxide semiconductor (nLDMOS) device or an n-channel extended drain metal oxide semiconductor (nEDMOS) device.

Referring to FIG. 1, an example of semiconductor device according to the present disclosure includes a well region 12 of a first conductive type (P) formed in a semiconductor substrate 10 and gate insulating layers 14 and 15 having different thicknesses from each other on the well region. Further, a gate electrode 16 is disposed on the gate insulating layers 14 and 15, and a source region 19 and a drain region 20 of a second conductive type (N) are disposed next to the gate electrode 16. For example, in a device in which the gate insulating layer 15 having a thin thickness is disposed adjacent the source region 19, the gate insulating layer 14 having a thick thickness is disposed close to the drain region 20. Because a drain voltage is higher than a source voltage, in this example, the thickness of the insulating layer is set to be thicker close to the drain region 20 than close to the source region 19.

The drain region 20 is formed a certain distance apart from a spacer 18 of the gate electrode 16. By spacing apart the drain region 20 and the spacer 18, a breakdown voltage of the semiconductor device may be increased. A non-salicide region for increasing a gate and drain breakdown voltage exists between the gate electrode 16 and the drain region 20 having a high concentration.

The same drain structure as that implemented in a standard logic CMOS process to which silicide is applied without the non-silicide region may be implemented in some examples. The source region 19 has the same structure as a source in a standard logic low-voltage CMOS process. Meanwhile, the source region 19 is formed while being overlapped with the spacer 18 formed on a side of the gate electrode 16.

Furthermore, the semiconductor device includes an extended drain junction region 13 that is formed under the thin gate insulation layer 15 as well as thick gate insulation layer 14. The extended drain junction region is extended to a portion of the well region 12 under the thin gate insulating layer 15 from the drain region 20.

A high drain current is supplied due to the extended drain junction region 13. Since ion implantation is performed onto the extended drain junction region 13 with energy higher than that in the drain region 20, the extended drain junction region surrounds the drain region 20. A function of the extended drain junction region 13 will be explained in detail again.

An N-type deep well region(DNW) 29 may be formed between the P-type well region 12 and the P-type substrate 10. The DNW region 29 is needed when the DMOS device is isolated from another device. For instance, in another DMOS device in which the P-type well region is disposed next to the DMOS device, since it is not required to isolate the DMOS device from another device, the DNW region may be not provided in the device.

Moreover, an isolation region 11 including a trench for isolating the DMOS device from a neighboring device is formed next to the drain region 20 or the source region 19. In this example, the trench may use one selected from STI, MTI (medium trench isolation), and DTI (deep trench isolation) depending on a specification needed for the device. Alternatively, a LOCOS oxide layer may be used instead of the trench.

A P-type well contact region 28 for applying a bias voltage to the P-type well region 12 may be disposed between the isolation region 11 and the source region 19. In addition, an N well contact region 27 for applying a bias voltage to the DNW region 29 may be disposed.

Further, the semiconductor device includes a lightly doped drain (LDD) region 17, and silicides 21, 22 and 23 disposed on the source region 19, the drain region 20 and the gate electrode 16. Furthermore, the semiconductor device further includes a source contact plug 24 and a drain contact plug 25 that are respectively disposed on the silicides 21 and 23.

Moreover, the semiconductor device may further include a medium well region (MVNM) 13a that is disposed between the extended drain junction region 13 and the drain region 20 and has a thickness thicker than that of the extended drain junction region 13. The medium well region 13a serves to reduce an electric field of the drain region 20 by allowing the medium well region to have a concentration lower than that of the drain region 20. The medium well region 13a has a concentration higher than that of the extended drain junction region 13. The medium well region 13a may be formed at the time of implanting ions to the LDD region 17 of a MV device. Accordingly, the LDD region 17 has the same concentration as that of the medium well region 13a.

The gate insulating layers having the different thicknesses from each other include the second gate insulating layer 14 and the first gate insulating layer 15. A layer having a thickness thicker than that of the first gate insulating layer 15 is used as the second gate insulating layer 14. In order to increase the drain current, only the first gate insulating layer 15 having a relatively thinner thickness may be used.

However, by allowing the second gate insulating layer 14 to have a large thickness, a high voltage can be applied to the drain region 20. Since the gate insulating layers 14 and 15 may be damaged due to the high voltage, when the thin first gate insulating layer 15 is formed close to the drain region 20, the insulating layer is damaged, so that device performance may be lost. The second gate insulating layer 14 has a thickness used in a medium-voltage device or a high-voltage device.

A voltage applied to the drain region 20 is equal to or greater than 3.3 V. Further, a voltage applied to the gate electrode 16 is the lowest gate voltage applied to a low-voltage device used in a digital block. In the present disclosure, a gate voltage of 0.5 V to 2 V is applied to the gate electrode. The device of the present disclosure needs to be disposed at a middle region to send a signal to a block of the high-voltage device from the digital block including a LV device.

Conventionally, the medium-voltage device or the high-voltage device is used. That is, a thick gate insulating layer suitable for the MV or HV device is used. However, when a voltage of 0.5 V to 2 V is applied to the gate electrode 16, since a drain current Idsat is too low, a width of a channel region needs to be increased. As a result, the size of the device is proportionally increased, and the device cannot be used in applications that require smaller size device.

Figure 2:
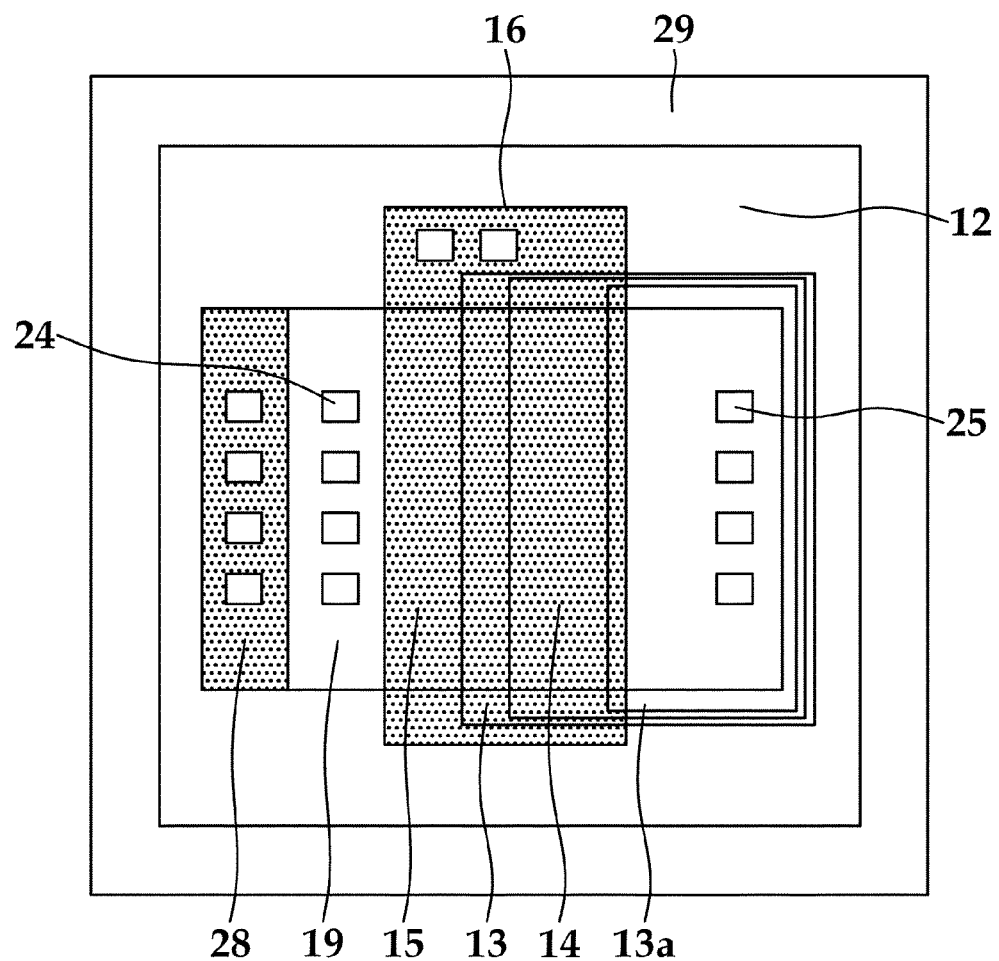
FIG. 2 illustrates a plan view of the stepped gate insulating layer DMOS semiconductor device illustrated in FIG. 1.

FIG. 2 illustrates a plan view of the semiconductor device according to the example of the present semiconductor device illustrated in FIG. 1. Referring to FIG. 2, the extended drain junction region 13 extends from the drain region 20 to the gate insulating layer 15 having a thinner thickness. The extended drain junction region extends to a portion of the well region under the thin gate insulating layer from the drain region. The medium well region 13*a* extends to the second gate insulating layer 14.

In addition, referring to FIG. 2, the single P-type well region 12 surrounds the drain region 20. By doing this, it is possible to enable easy device isolation, and there is an advantage in terms of a chip size.

The aforementioned structure is different from a structure in which the well region 12 and the extended drain junction region 13 come in contact with each other by using an n-drifted well region instead of the extended drain junction region 13 in a BCD device, that is, a typical RESURF LDMOS device (T. Efland et. al, page 237, IEDM, 1992). In the structure suggested by T. Efland, a LOCOS oxide layer is disposed instead of the second gate insulating layer 14 of the present disclosure, the extended drain junction region 13 does not exist, and only the n-drifted well region exists.

Further, the aforementioned structure is different from a structure in which a stepped gate oxide layer exists and source and drain regions are formed by forming two wells in one device (D. G. Lin, page 963, IEDM, 1995). In the structure suggested by D. G. Lin, an N+ drain region is not isolated by the P-type well region 12 unlike the example of semiconductor device described above. Moreover, the extended drain junction region 13 of the present disclosure that is formed to extend to the first gate insulating layer 15 while surrounding the N+ drain region does not exist.

Figure 3:
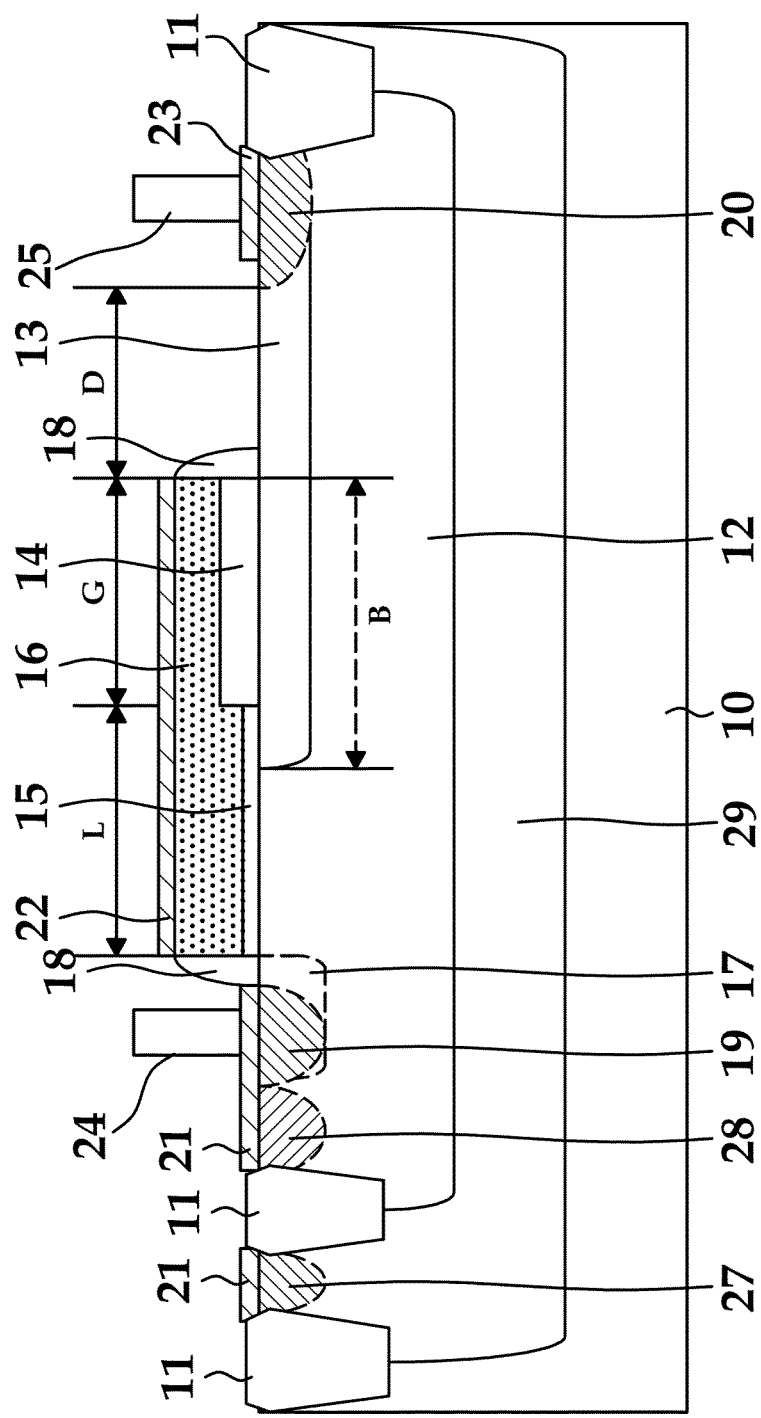
FIG. 3 illustrates a cross-sectional view of another example of a stepped gate insulating layer DMOS semiconductor device.

A stepped gate insulating layer DMOS semiconductor device according to an example of the present disclosure illustrated in FIG. 3 has a structure similar to the structure according to the aforementioned example. However, only the extended drain junction region 13 is formed without the medium well region 13*a*. It is possible to design the device by using only the extended drain junction region 13. Since the medium well region 13*a* does not exist, it is possible to simplify the process. In addition, when the device is manufactured by using only the extended drain junction region 13, it is required to further increase a doping concentration in comparison to the first example in order to obtain a higher drain current.

The extended drain junction region 13 may be formed through ion implantation for logic well threshold voltage adjustment with low energy used when the LV device is formed. Since energy of the logic well threshold voltage ion implantation is low, it is possible to thinly form the extended drain junction region to be close to a surface of the substrate 10. Alternatively, the extended drain junction region may be formed by a LDD ion implantation process performed after forming the gate electrode.

Figure 4:
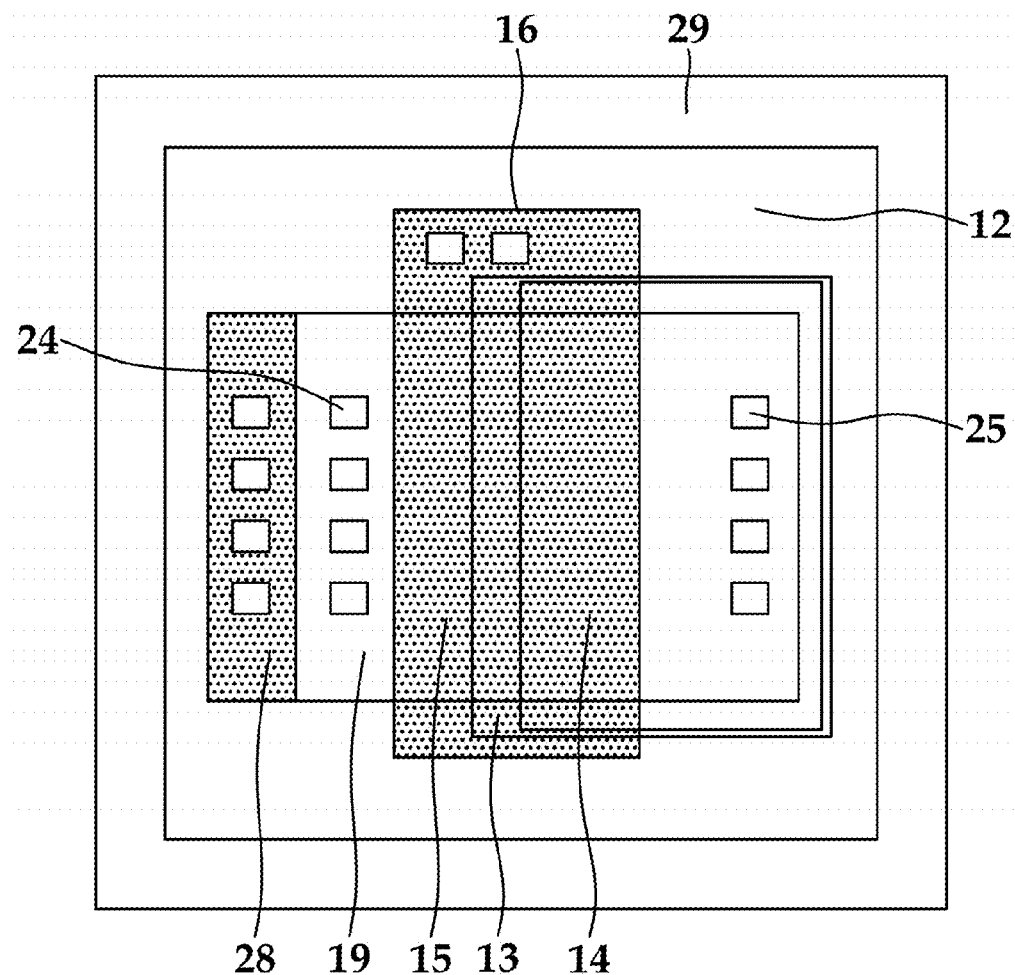
FIG. 4 illustrates a plan view of the stepped gate insulating layer DMOS semiconductor device illustrated in FIG. 3.

FIG. 4 illustrates a plan view of another example of a semiconductor device. The semiconductor device has a structure similar to the example illustrated in FIG. 2 except for the medium well region 13*a*.

The extended drain junction region 13 stated above is described in detail. By extending the extended drain junction region 13 from the drain region 20 up to a part of the first gate insulating layer 15 as well as the second gate insulating layer 14, even in the low-voltage gate input voltage, it is possible to supply a drain current having a magnitude ten times that of the existing medium-voltage device or high-voltage device. This is because a stepped gate insulating layer obtained by combining the LV gate insulating layer (the first gate insulating layer) 15 and the MV gate insulating layer (the second gate insulting layer) 14 or combining the LV gate insulating layer (the first gate insulating layer) 15 and a HV gate insulating layer (a third gate insulating layer) 14*a* is used as the insulating layer while using the extended drain junction region 13. That is, this is because the thin gate insulating layer exists.

It is possible to reduce the size of the chip without increasing an isolation rule by increasing the drain current for the gate voltage and optimizing the extended drain junction region 13 to be suitable for the MV and HV processes.

Further, because this semiconductor device has excellent channel length modulation (CLM) in the low-voltage gate input, it is possible to achieve a stable circuit configuration and to form an region between the gate region and drain region in a planar type. A thick LOCOS or STI insulting layer may be used between the gate electrode 16 and the drain region 20. In this example, the unevenness may occur between the gate insulating layers 14 and 15 and the drain region 20 to reduce a drain current speed. Accordingly, it is advantageous to form the surface of the substrate 10 between the first gate insulating layer 15 and the drain region 20 to be coplanar without forming the LOCOS or STI insulating layer.

Figure 5:
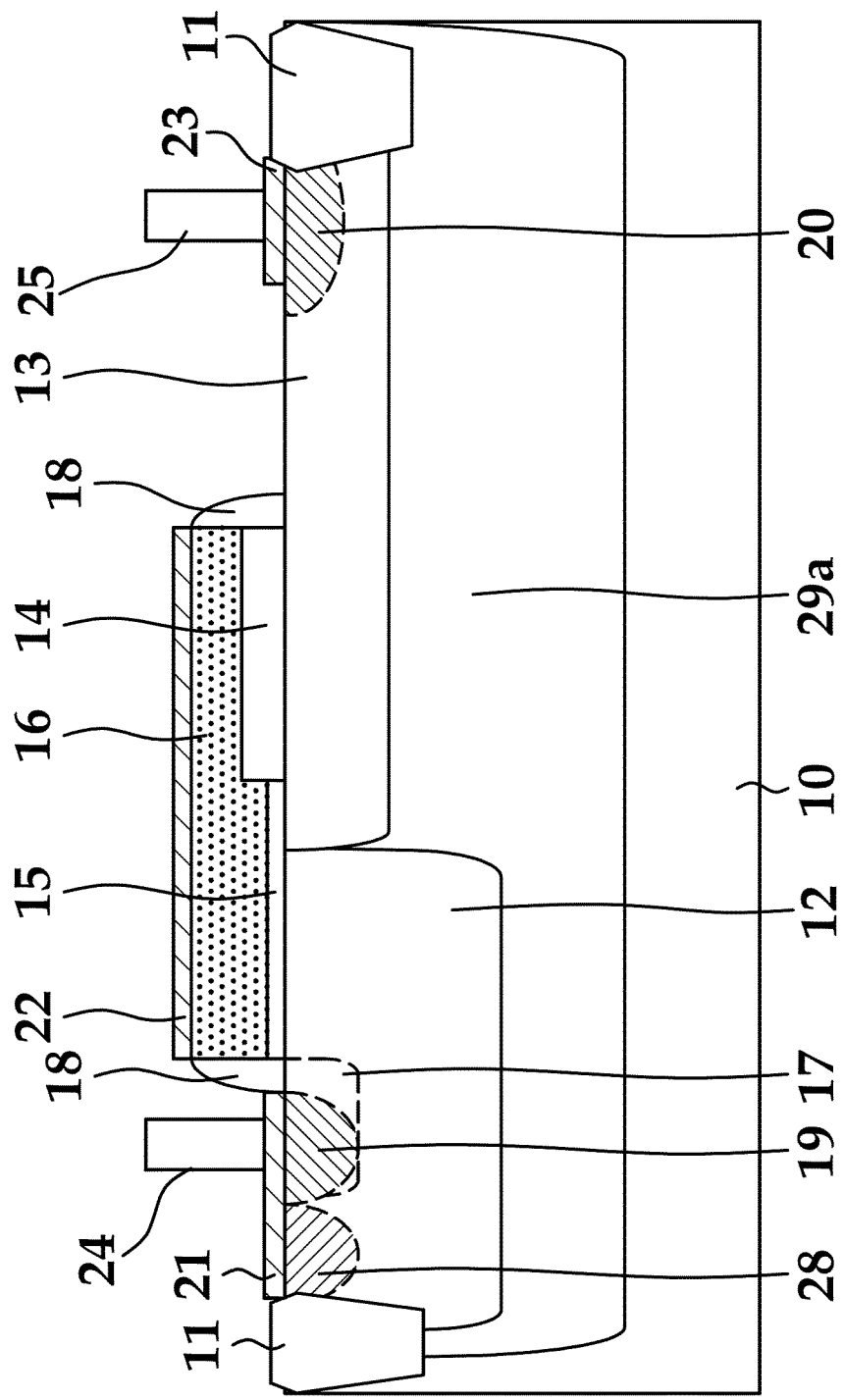
FIG. 5 illustrates a cross-sectional view of another example of a stepped gate insulating layer DMOS semiconductor device.

FIG. 5 illustrates another example of a semiconductor device. In a stepped gate insulating layer DMOS semiconductor device according to an example illustrated in FIG. 5, the P-type well region 12 is disposed to surround only the source region 19. In the example illustrated in FIG. 3, the P-type well region 12 is formed to also surround the drain region 20; in the example illustrated in FIG. 5, the P-type well region extends so as not to reach the drain region 20. Instead, the extended drain junction region 13 is formed to come in contact with the P-type well region 12. Further, in order to isolate the N-type drain region 20, a P-type high voltage Well region (HPW) 29*a* used in the HV device surrounds the P-type well region 12, the drain region 20 and the extended drain junction region 13. Moreover, similarly to the aforementioned example, an extended drain junction region 13 that is formed under the thin gate insulation layer 15 as well as thick gate insulation layer 14. The extended drain junction region is extended to a portion of the well region 12 under the thin gate insulating layer 15 from the drain region 20 while surrounding the drain region 20.

Such a structure is appropriate for a device requiring a higher drain voltage. For example, such a structure is appropriate for a device requiring a drain voltage of 9 V, 13.5 V, or 18 V. Accordingly, the N-type extended drain junction region 13 is formed as an N-type drifted region. The N-type drifted region has a depth deeper than that of the N-type extended drain junction region 13 in the aforementioned example and a dopant concentration lower than that thereof. In addition, instead of the STI isolation layer, the MTI isolation layer having an isolation region deeper than that of the STI isolation layer is used as the isolation region 11.

Figure 6:
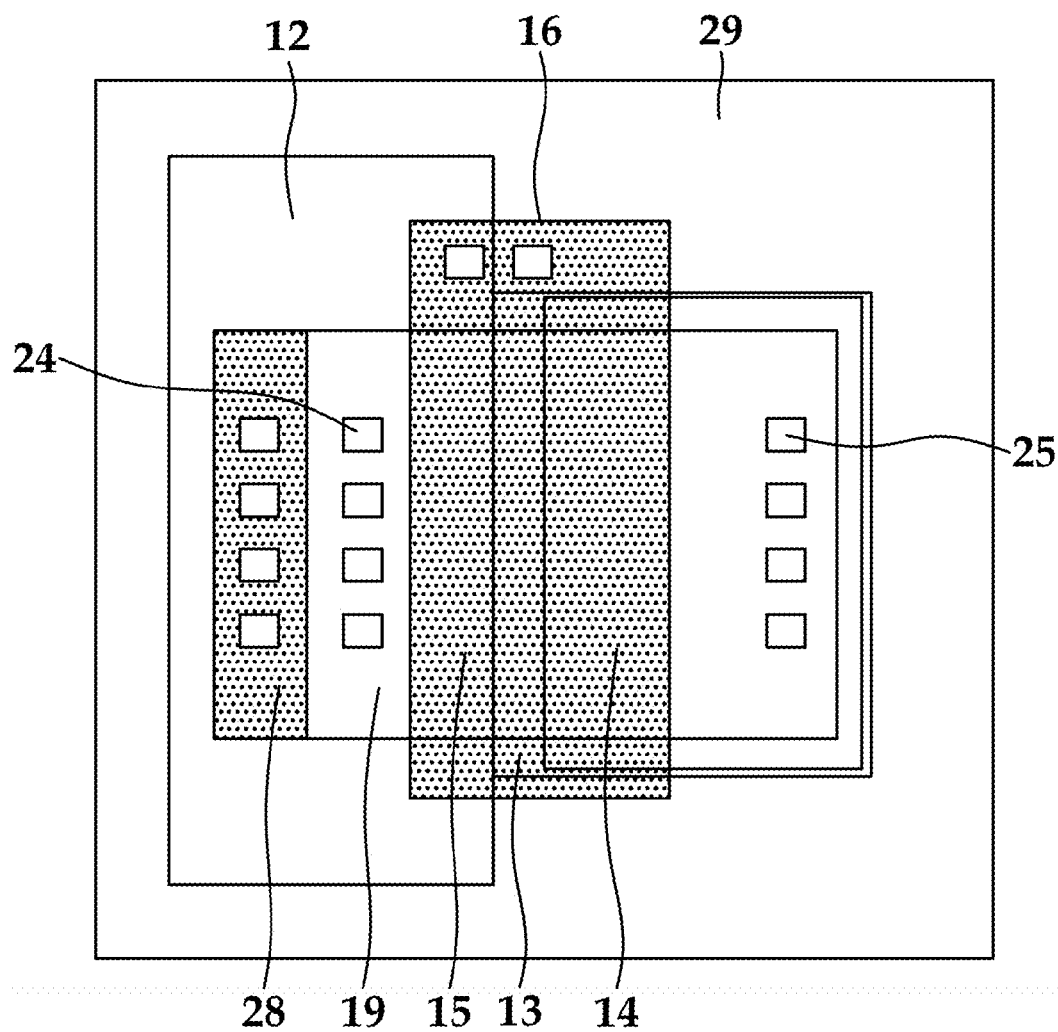
FIG. 6 illustrates a plan view of the stepped gate insulating layer DMOS semiconductor device illustrated in FIG. 5.

FIG. 6 illustrates a plan view of an example of semiconductor device. The semiconductor device has a structure in which the P-type well region 12 has a region smaller than that in the aforementioned second example.

An example of a method for manufacturing a stepped gate insulating layer DMOS device according to the present disclosure will be now explained in detail with reference to FIGS. 7 to 10.

Figure 7:
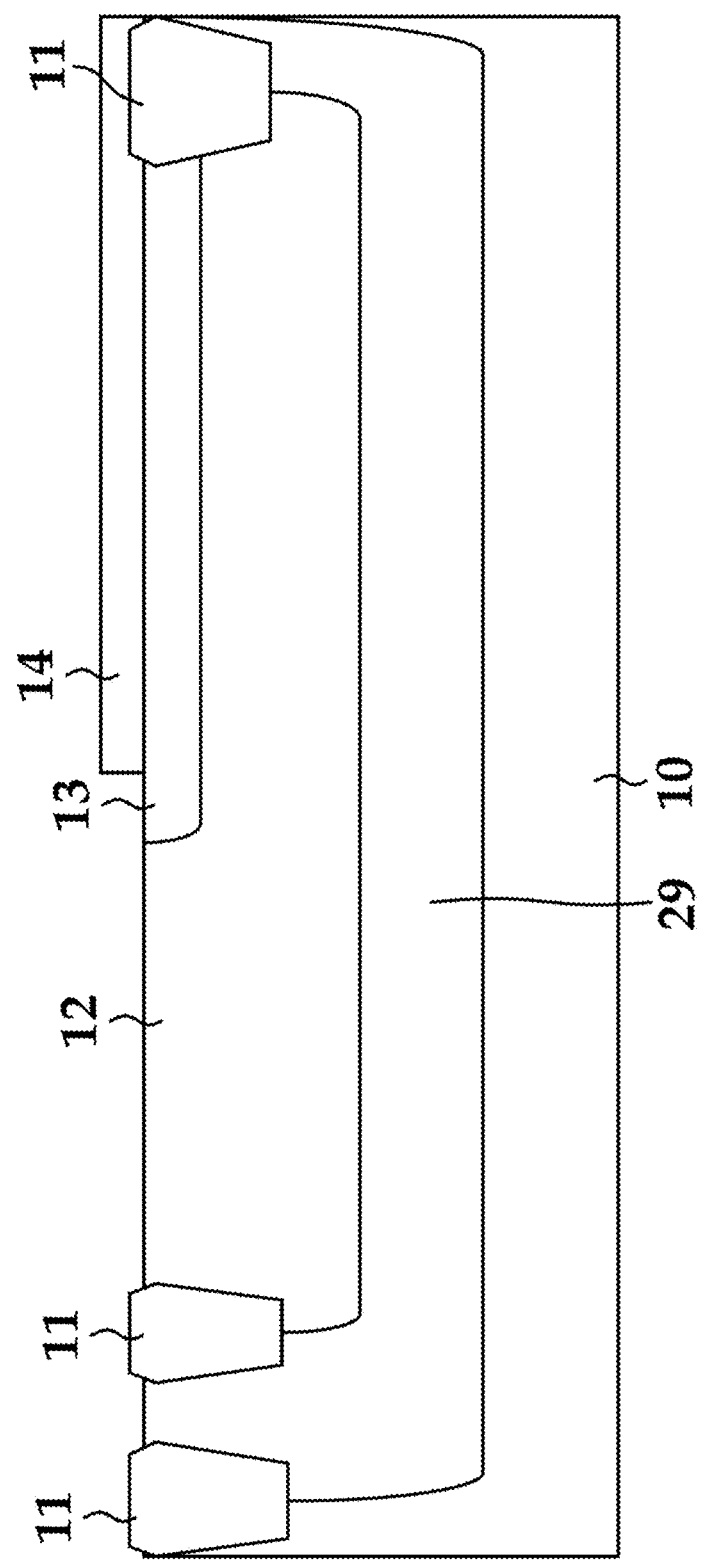
FIGS. 7 to 10 illustrate cross-sectional views of a stepped gate insulating layer DMOS device during an example of a method for manufacturing the same according to the present disclosure.

First, referring to FIG. 7, a substrate 10 is formed. The substrate 10 may be a semiconductor substrate, and may be formed using a P-type silicon thin plate.

Next, a DNW region 29 is formed in the substrate 10 by a doping process. Next, isolation regions 11 of narrow trenches (STI) are formed. The isolation regions 11 may be obtained by forming a plurality of trenches at a plurality of different positions from each other as illustrated in FIG. 7, and filling the trenches with a dielectric material.

A well region 12 is formed in the substrate 10 between the isolation regions 11. The well region 12 may be formed as one type selected from a LV well, a MV well and a HV well. That is, the well region 12 is obtained when an LV well, an MV well or a HV well is formed. Accordingly, it is not required to add a separate mask for the DMOS device. In this example, the well region 12 is formed with a greater depth than the isolation region 11 by using a P-type dopant.

Thereafter, an extended drain junction region 13 is formed in one side of the well region 12. For example, the extended drain junction region 13 may be formed when low-energy well threshold voltage ion implantation of the CMOS device is performed.

In this way, the extended drain junction region 13 may be formed through the low-energy well threshold voltage ion implantation in the standard logic CMOS process performed before a gate oxidizing process without using the separate mask. Alternatively, the extended drain junction region may be formed through the LDD ion implantation performed after forming the gate electrode. A mask for the extended drain junction region 13 may be added as necessary.

In this example, a junction boundary between the extended drain junction region 13 and the well region 12 needs to be less than the depth of the trench isolation region 11. When the depth is increased, the device is not isolated from another device. By using the extended drain junction region 13 having a depth shallower than that of the STI, it is possible to use a minimum active and well isolation design rule of the logic device, so that it is possible to implement a complete isolation structure without increasing the chip size by using the logic deep N-type well region.

In the N-type MOSFET, by implanting ions with an energy of 20 to 100 KeV by using phosphorous or arsenic, a junction depth of the extended drain junction region may be set to approximately 500 Å to 3500 Å, and an ion dose may be set to approximately 1 E12 to 1 E14/cm$^2$. Accordingly, a doping concentration of a surface extended drain junction region may range approximately 1 E17 to 1 E19 atoms/cm$^3$.

In the P-type MOSFET, by using boron or BF$_2$, a depth of an extended drain junction region may be set to approximately 500 Å to 3500 Å, and an ion dose may be set to approximately 1 E12 to 1 E14/cm$^2$. A surface doping concentration of the extended drain junction region may be approximately 1 E17 to 1 E19 atoms/cm$^3$.

Further, a second gate insulating layer 14 is formed on the entire region of the substrate 10. The second gate insulating layer is use for the HV device or the MV device. That is, the second gate insulating layer is an insulating layer for a HV device or a MV device. A gate voltage of the MV device is 5 V to 10 V, and a gate voltage of the HV device is equal to or greater than 5 V to 10 V. A thickness of the second gate insulating layer 14 varies depending on the gate voltage to be used. In this example, the second gate insulating layer is deposited to have a thickness of 100 Å to 300 Å. The gate insulating layer may be formed by oxidizing a silicon substrate at a temperature of 700° C. to 1000° C. An oxygen (O$_2$) gas or water steam (H$_2$O$_{(g)}$) may be used for the oxidation. The thick second insulating layer 14 is not the LOCOS oxide layer for forming RESURF.

As illustrated in FIG. 7, in this example, the second gate insulating layer 14 is formed such that only a portion above the extended drain junction region 13 remains after a part of the gate insulating layer close to the well region 12 is removed by using a mask (not illustrated) through wet-etching.

The extended drain junction region 13 may overlap with the gate insulating layer 14 under the gate. Further, a width of the extended drain junction region 13 that overlaps with the gate insulating layer 14 may further extended toward the left from at least a left end of the gate insulating layer 14. A length of the extended drain junction region that is further extended toward the left from at least the left end of the gate insulating layer 14 may be approximately 0 μm to 0.5 μm. When the length is equal to or greater than 0.5 μm, the extended drain junction region overlaps excessively with the thin gate insulating layer 15 to be formed later, so that drain current density may be considerably decreased.

Figure 8:
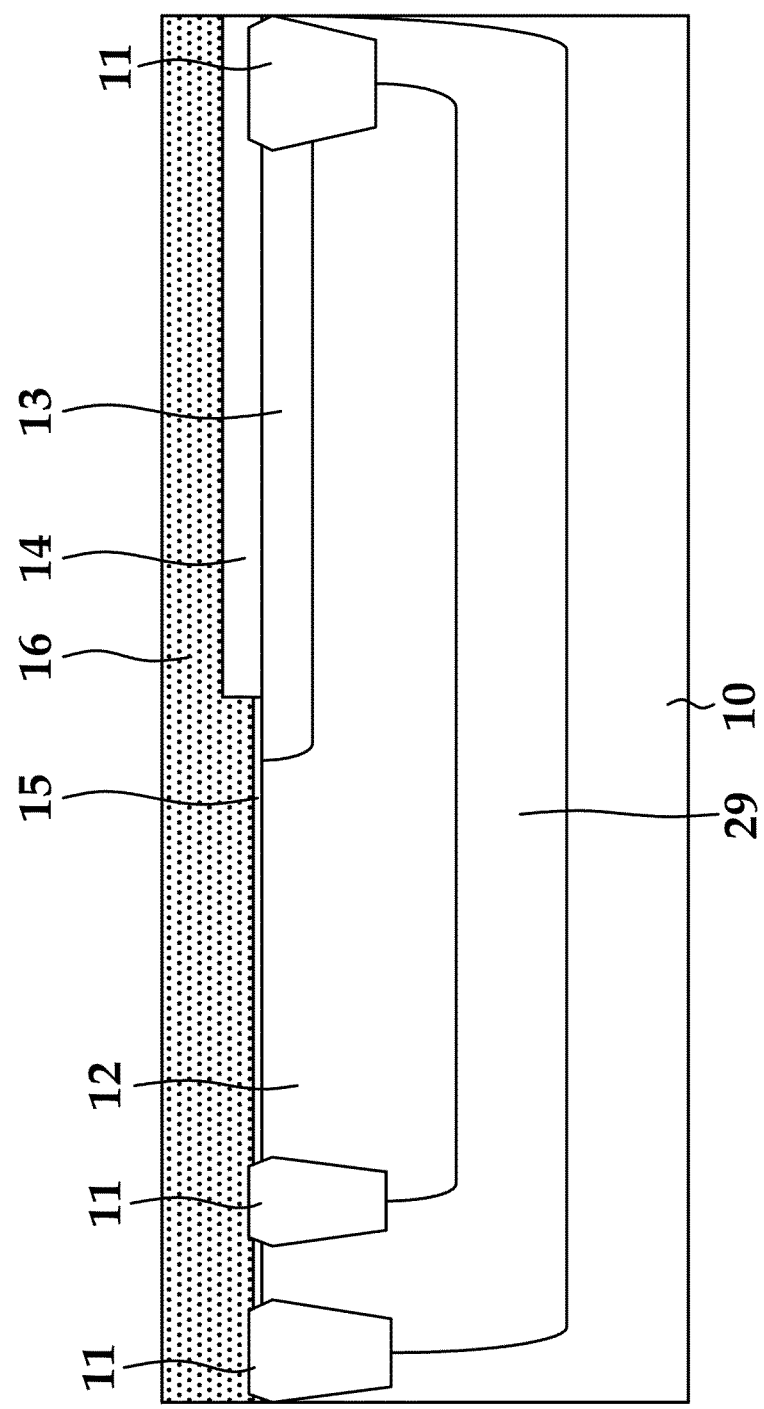

Referring to FIG. 8, the first gate insulating layer 15 is formed on the well region 12. The first gate insulating layer is used as the gate insulating layer for the LV device. The gate voltage in the LV device is 0.5 V to 4 V. Similarly to the second gate insulating layer, the first gate insulating layer is grown by oxidizing a silicon substrate at a high temperature. The thickness of the first gate insulating layer may be increased while oxidizing the second gate insulating layer. The thickness of the first gate insulating layer 15 may be thinner than that of the second gate insulating layer 14 formed on the extended drain junction region 13. By making the thickness of the first gate insulating layer 15 thinner, a high drain current is obtained through the thin first gate insulating layer 15. Further, a desired threshold voltage may be obtained. In this example, the first gate insulating layer has a thickness of 5 Å to 50 Å so as to be appropriate for the lowest gate voltage.

Polysilicon is formed on the second gate insulating layer 14 and the first gate insulating layer 15, and N-type ions are doped into the polysilicon. By doing this, doping efficiency of the N+ gate electrode is increased. Thereafter, the gate electrode 16 is formed by etching a part of the polysilicon by using a mask.

Accordingly, the gate electrode 16 is formed on the thin gate insulating layer 15 and the thick gate insulating layer 14. The gate electrode 16 is divided into two portions. That is, the gate electrode may be divided into a first gate electrode 16a formed on the thin gate insulating layer 15 and a second gate insulating layer 16b formed on the thick gate insulating layer 14.

A length of the first gate electrode is approximately equal to a length of the second gate electrode. The first gate electrode is a gate electrode on a channel region, and the second gate electrode is a gate electrode on the extended drain junction region 13. In this example, in order to obtain a lower threshold voltage, it is defined that a length of the extended drain junction region 13 is longer than a length G of the second gate electrode 16b, as illustrated in FIG. 10.

Figure 9:
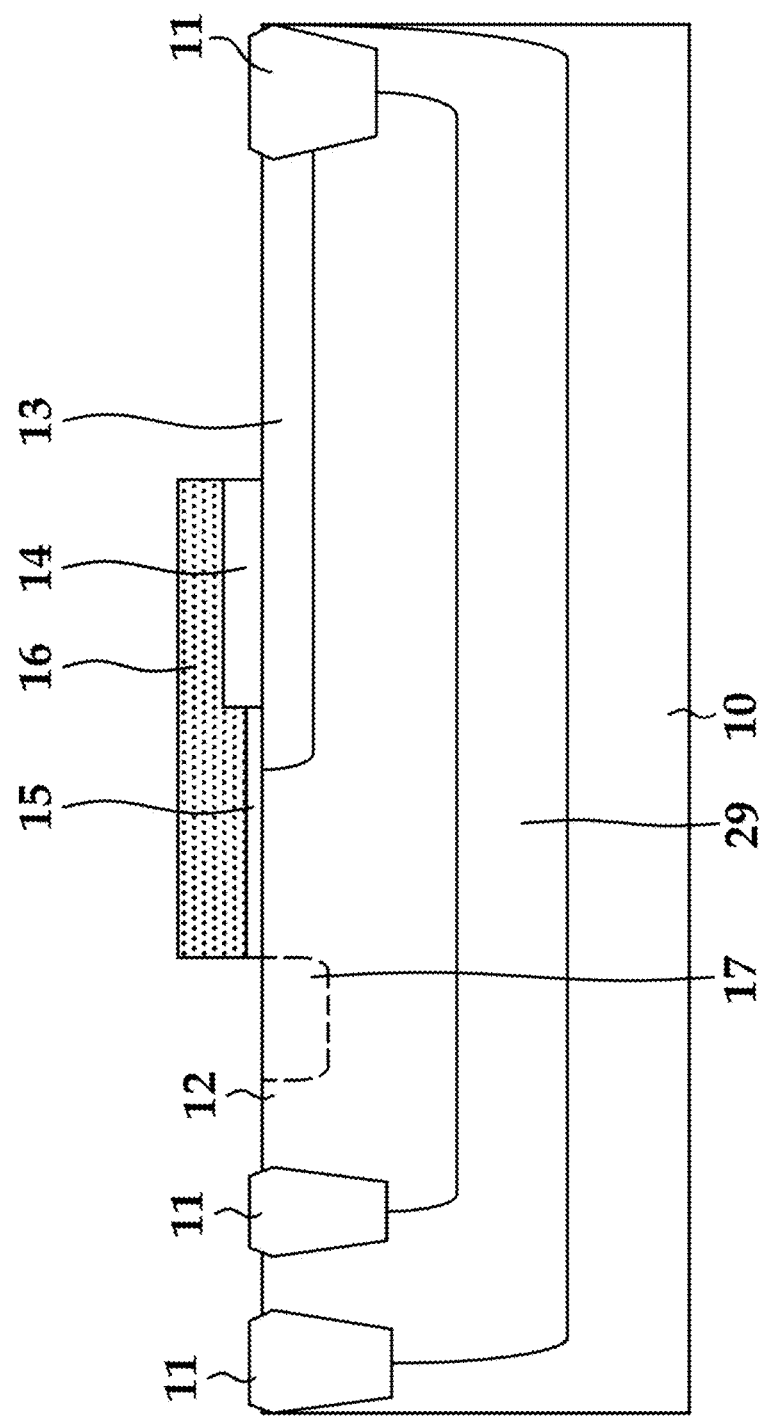

Referring to FIG. 9, the LDD region 17 is formed in the well region 12 on one side of the first gate insulating layer 15. In this example, although it has been illustrated that the LDD region 17 is formed in the source region, the LDD region may also be formed in the drain region. In FIG. 9, a MV LDD region may be additionally formed between the gate electrode 16 and the drain region 20. The LDD ion implantation for forming the MV LLD region may be simultaneously performed with the LDD ion implantation process used for forming the HV LDD device, the MV LDD device or the LV LDD device. Accordingly, it is not require an additional mask.

Figure 10:
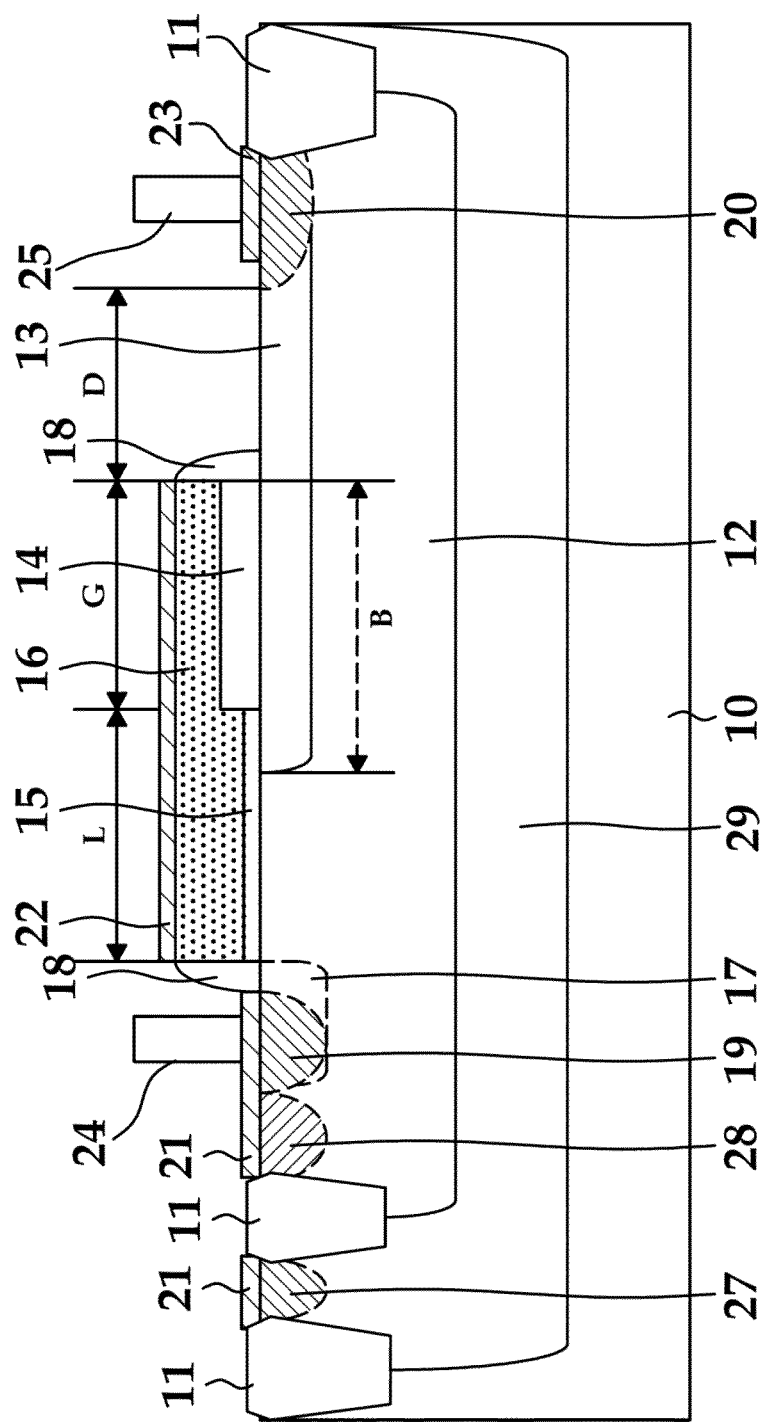

As illustrated in FIG. 10, the spacers 18 are formed on both sides of the gate electrode 16. Thereafter, the source region 19, the drain region 20, the P-type well contact region 28, and the N-type well contact region 27 are formed in the well region 12 and the extended drain junction region 13. In this example, the N-type drain region is surrounded by the N-type extended drain junction region and is also surrounded by the P-type well region 12 to be isolated from another region. In addition, the N-type drain region is isolated from a drain region of another device disposed next to the isolation region 11 next to the drain region 20.

Since the source region 19 and the LDD region 17 are surrounded by the P-type well region 12, the P-type well region 12 existing between the source region 19 and the N-type extended drain junction region becomes a channel region. Since the thin gate insulating layer 15 is formed on the channel region, it is possible to a high saturation drain current IDsat.

Subsequently, the silicides 21, 22 and 23 such as cobalt silicide ($CoSi_2$), titanium silicide ($TiSi_2$), and nickel silicide (NiSi) are formed on the source region 19, the drain region 20 and the gate electrode 16.

The silicides 21, 22 and 23 may be non-salicides or salicides.

The term "salicide" is a compaction of the phrase "self-aligned silicide." The term "silicide" refers to a process in which contact resistance components are reduced by forming a metal on a surface of silicon to react, whereas the "salicide" is an application of a silicide material and refers a process in which an electrical connection between the gate and the source or the drain is prevented during the silicide process by using a sidewall formed adjacent the MOSFET gate. Since a sidewall spacer of the gate is used as a mask without using a separate mask, it is called a salicide.

Thereafter, the source contact plug 24 and the drain contact plug 25 are formed on the silicides 21 and 23 formed on the source region 19 and the drain region 20.

Through the aforementioned procedure, it is possible to manufacture the stepped gate insulating layer DMOS device according to the example of the present disclosure as illustrated in FIG. 10.

Figure 11:
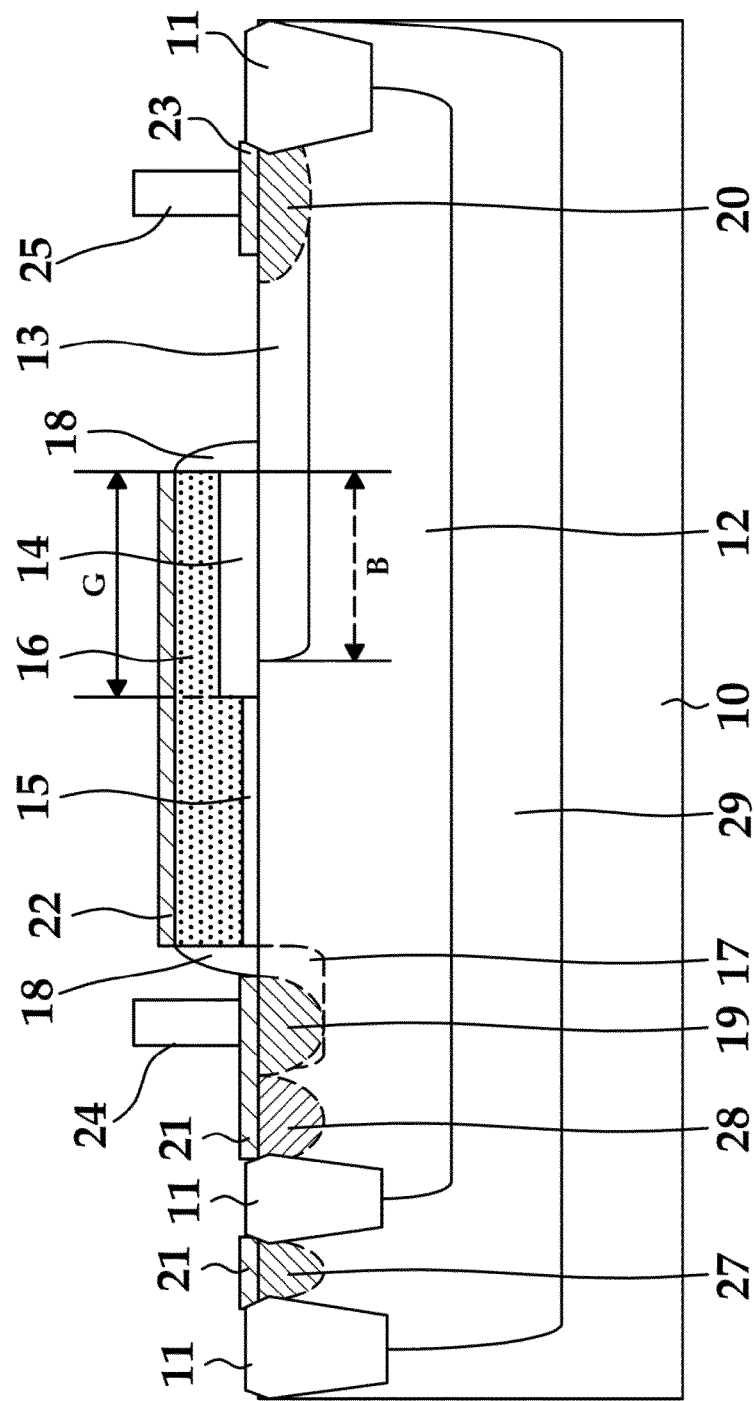
FIG. 11 illustrates a cross-sectional view of another example of a stepped gate insulating layer DMOS device.

FIG. 11 illustrates a cross-sectional view of a stepped gate insulating layer DMOS device according to an example of the present disclosure, and illustrates an example in which a threshold voltage is adjusted by the second gate insulating layer. The extended drain junction region 13 does not extend to the first gate insulating layer 15 and is formed to surround only a part of the second gate insulating layer 14.

The extended drain junction region 13 is formed in the well region 12 under the thick gate insulation layer 14, but not under the thin gate insulation layer 15. The extended drain junction region is extended to a portion of the well region 12 under the thick gate insulating layer 14 from the drain region 20.

In this example, a length B of the extended drain junction region 13 is shorter than a length G of the gate poly 16 overlapped with the extended drain junction region 13. By setting the length G to be greater than the length B, the threshold voltage is prevented from being decreased by the thin gate insulating layer 15 and the threshold voltage is adjusted by the second gate insulating layer 14.

Thus, by adjusting the length of the extended drain junction region 13, a desired threshold voltage may be obtained. The processes for forming the stepped gate insulating layer extended drain MOSFET is the same as a forming process of a back-bone standard process to which the present device is applied, and a mask for the extended drain junction region may be separately added.

Figure 12:
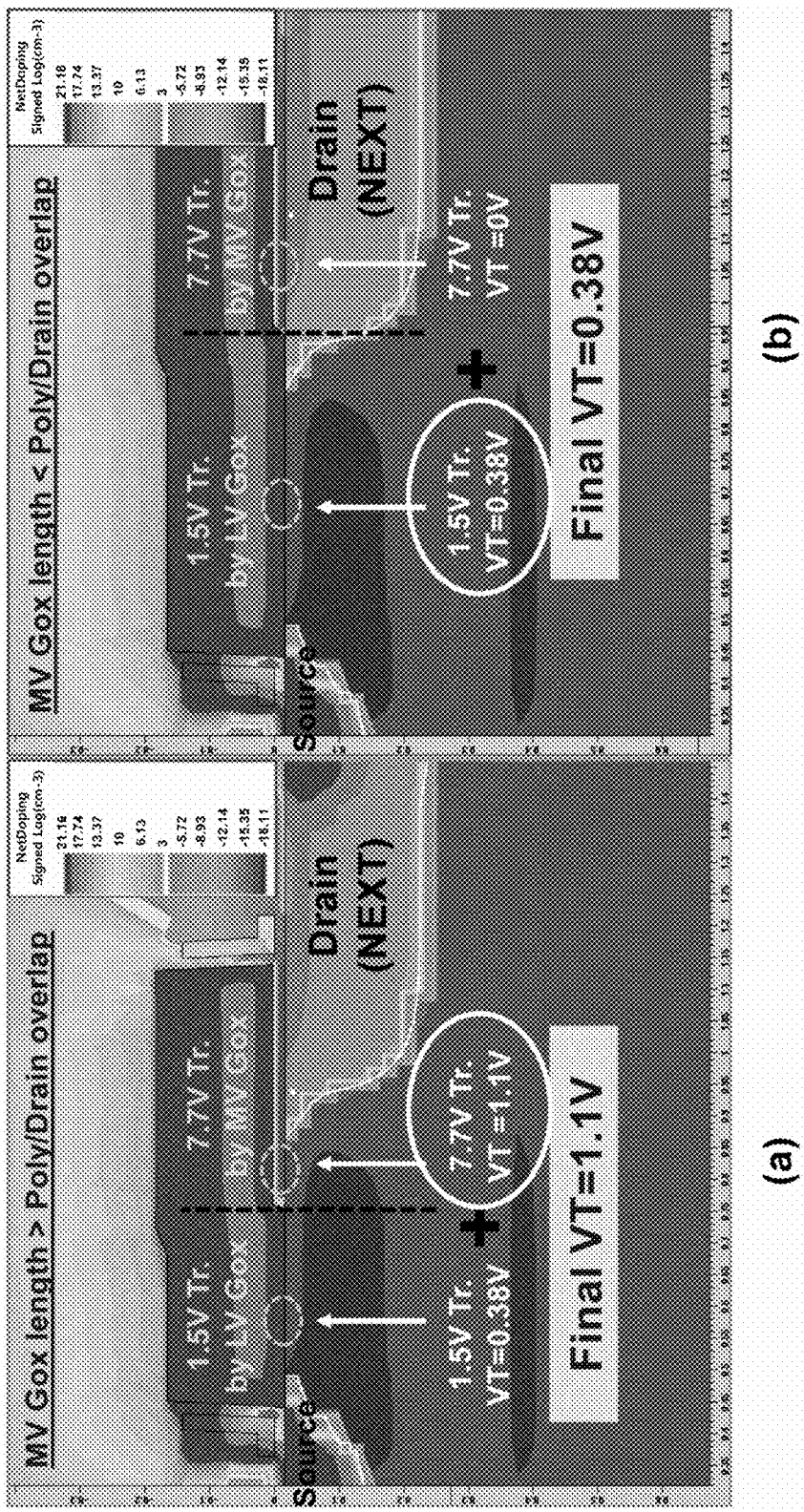
FIG. 12 is a diagram illustrating device characteristics generated due to an overlay of a gate electrode in a channel region.

FIG. 12 illustrates the effect on device characteristics resulting from the overlap between the gate electrode 16 and the channel region on which the extended drain junction region 13 and the MV gate insulating layer 14 or the HV gate insulating layer 15 are formed.

Referring to FIG. 12(a), when an N-extended drain junction region does not surround the MV gate insulating layer (or the HV gate insulating layer) of the stepped gate insulating layer, the LV device formed by the LV gate insulating layer or the MV device (or the HV device) formed by the MV gate insulating layer (or the HV gate insulating layer) coexists. Accordingly, among two devices, the device having a high threshold voltage is selected. In this example, the total threshold voltage is determined as 1.1 V. This high threshold voltage is obtained because the channel region is increased to extend to the thick gate insulating layer.

In contrast, when the extended drain junction region surrounds the MV gate insulating layer or the HV gate insulating layer of the stepped gate insulating layer as illustrated in FIG. 12(b), that is, when the extended drain junction region extends up to the first gate insulating layer 15, only the LV device by the LV gate insulating layer is formed, and the MV device (or the HV device) disappears due to the extended drain junction region. The disappearing indicates that the threshold voltage is determined by the first gate insulating layer 15. Since the N-type well region other than the P-type well region is formed under the MV device or the HV device, the channel region does not exist under the MV or HV gate insulating layer; rather, the channel region exists only under the first gate insulating layer. In this way, the threshold voltage is adjusted by the first gate insulating layer 15. In this example, the threshold voltage has a low value of about 0.38 V, as illustrated in FIG. 12(b).

When the stepped gate insulating layer extended drain MOSFET is used, it is possible to obtain drain current performance ten times that of an example in which the extended drain junction region does not exist. By doing this, a gate width is decreased to 1/10 of a gate width of the MV device or the HV device in which a width is increased by a multi-finger structure in order to obtain a desired drain current, so that the chip size can be effectively decreased. Moreover, because it is possible to obtain the same threshold voltage as that of the LV device, there is an advantage in terms of a circuit speed. Since the channel length modulation is stable in comparison to the MV or HV device, it is possible to increase the stability of the circuit.

FIG. 13A to 13D illustrate a change in various device characteristics depending on a difference (a "B-G" value) between a length "B" of the extended drain junction region 13 overlapped with the entire gate electrode 16 and a length "G" of the gate electrode 16 overlapped with the thick gate insulating layer 14. In these examples, it can be seen that a saturation drain current IDsat of 100 μA/μm or more and a breakdown voltage BVdss of 10 V or more may be obtained in an operation voltage.

Figure 13A:
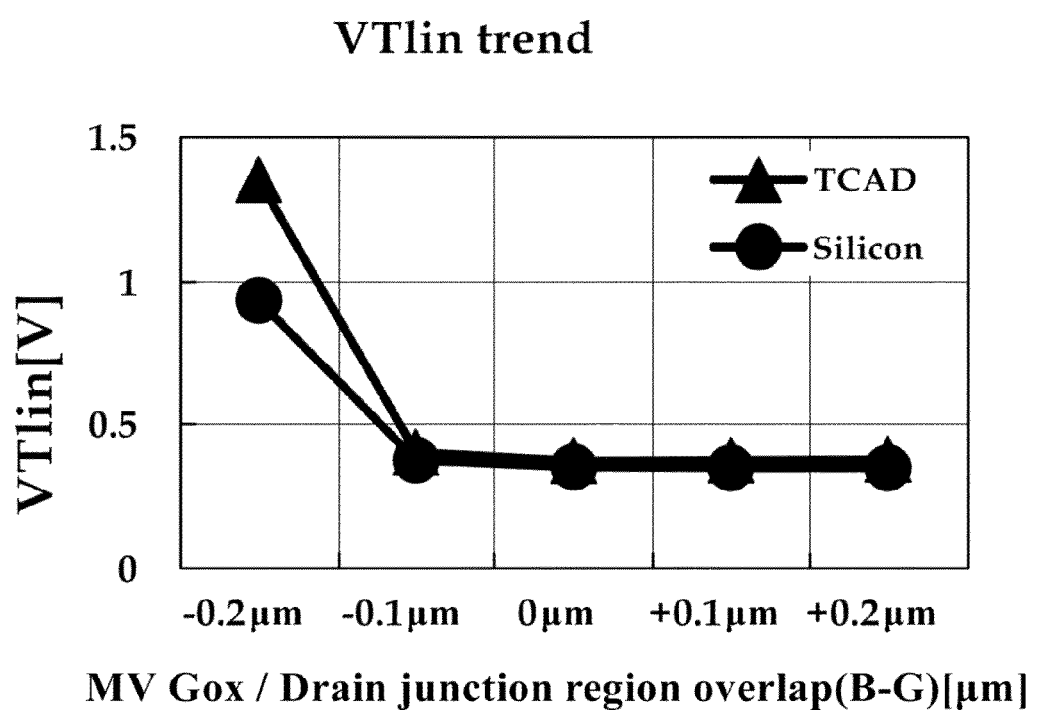
FIG. 13A to 13D is a graph illustrating a change in device characteristics depending on a difference between a length of an extended drain junction region and a length of a gate poly.

Referring to FIG. 13A, it can be seen that a threshold voltage of 0.5 V or less is obtained when a "B-G" value is −0.1, 0, 0.1, and 0.2 μm. The "B-G" value is equal to or greater than −0.1 μm. That is, in a device in which the length of the extended drain junction region 13 is greater than the length of the overlapping gate electrode (gate poly) 16, a stable threshold voltage can be obtained. Meanwhile, when the "B-G" value is less than −0.1 μm, for example, when the "B-G" value is −0.2 μm, the threshold voltage is rapidly increased to a level of 1 V to 1.5 V.

Accordingly, the difference ("B-G" value) between the length "B" of the extended drain junction region 13 overlapping with the gate electrode 16 and the length "G" of the gate electrode (gate poly) 16 overlapping with the thick gate insulating layer 14 is controlled to be −0.1 μm or more. In other words, in this example, the difference (the "G-B" value) between the length "G" of the gate electrode 16 overlapped with the thick gate insulating layer 14 and the length "B" of the extended drain junction region that overlaps with the gate electrode is approximately 0.1 μm or less.

Figure 13B:
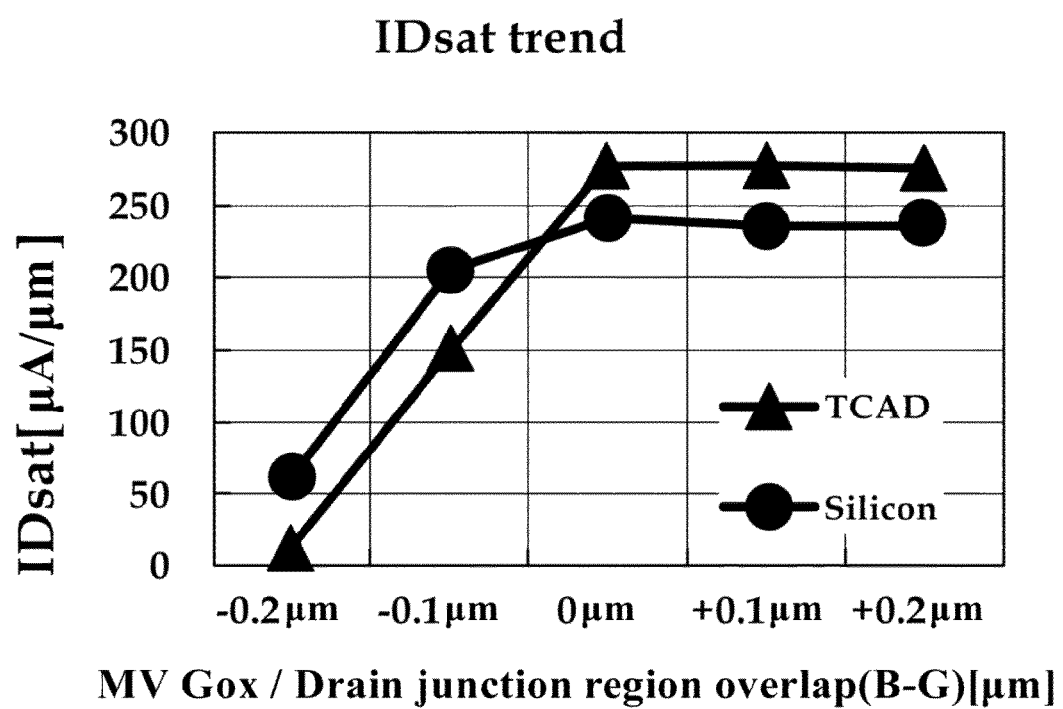

The same is true of the saturation drain current IDsat. Referring to FIG. 13B, it can be seen that a high drain current is obtained when the B-G value is −0.1, 0, 0.1, and 0.2 μm. This is because the thin gate insulating layer having 5 to 50 Å is formed in the channel region and the extended drain junction region 13 extends to under the thin gate insulating layer. Accordingly, since the thin gate insulating layer exists on the channel region, a high drain current is obtained. The threshold voltage is adjusted by the thin gate insulating layer.

In this way, in order to adjust the threshold voltage by the thin gate insulating layer, the length B of the extended drain junction region 13 needs to be at least greater than the length G of the gate poly 16 that overlaps with the extended drain junction region 13. Since the threshold voltage is rapidly changed adjacent the G-B value of 0.1 μm, it is important to adjust a photo overlay shift between the thick gate insulating layer and the extended drain junction region 13 to be ±0.1 μm or less. In the event that the photo overlay shift is greater than ±0.1 μm, a rapid change in device characteristics may result.

Figure 13C:
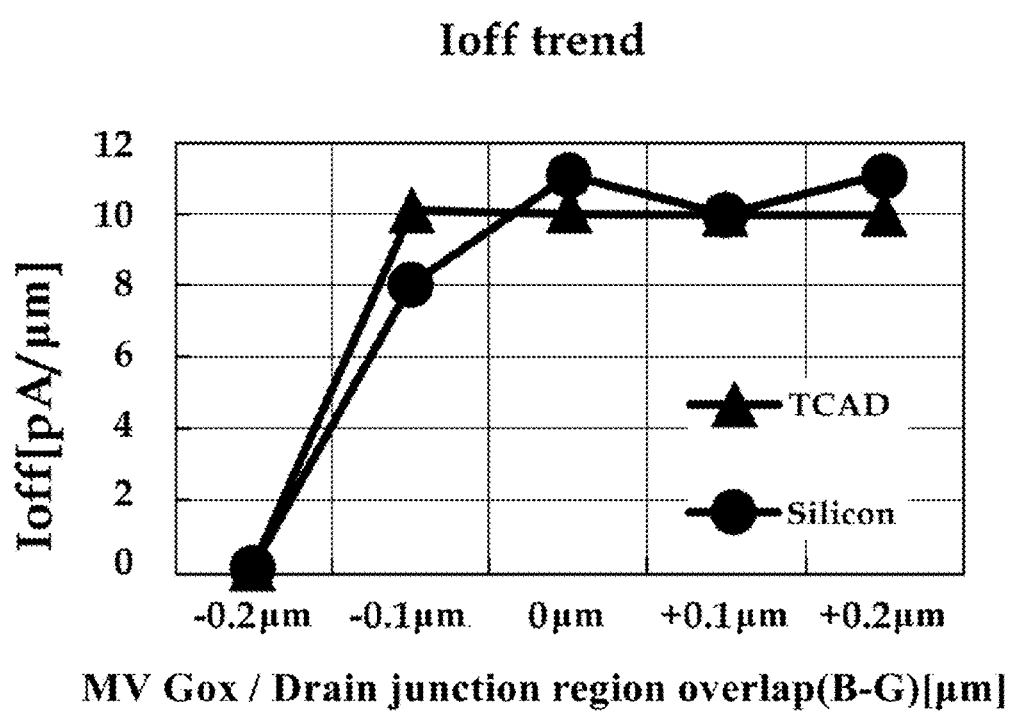
Figure 13D:
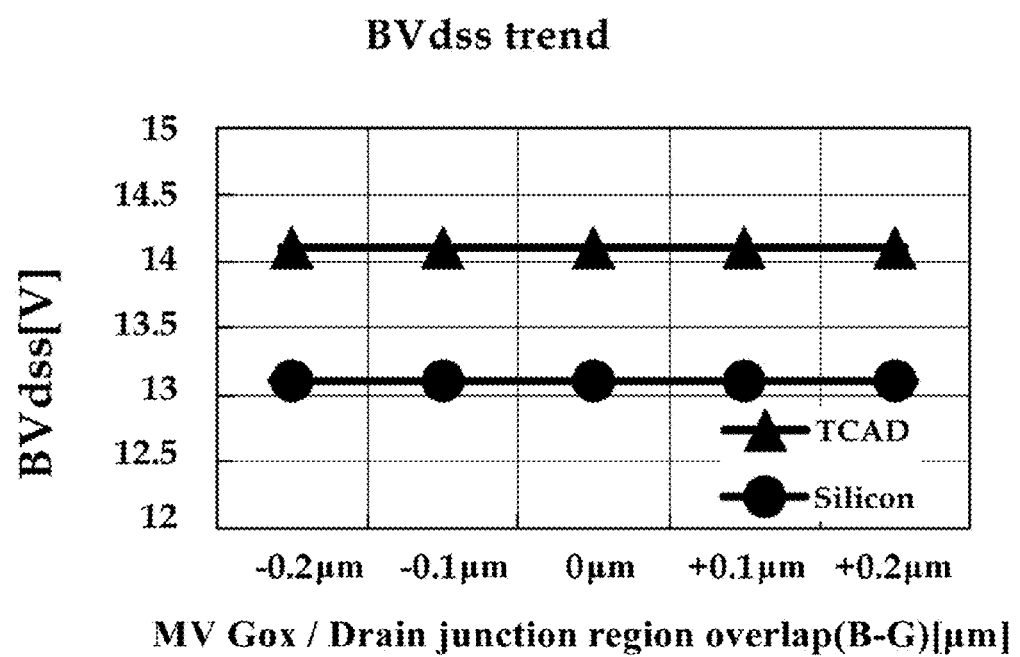

Further, referring to FIG. 13C, it can be seen that an Ioff value of the device corresponds to a very low off leakage current value of approximately 12 pA/μm or less. Referring to FIG. 13D, it can be seen that a breakdown voltage of the device is a high voltage of 12 V or more.

As described above, in order to have the high drain current and breakdown voltage, the following conditions need to be satisfied. Referring to FIG. 10, an "L" value is 0.1 to 2.0 μm. In this example, the "L" value is a length of the gate overlapped with the thin gate insulating layer. The "L" may be an effective channel length and may be changed so as to be extendable.

A "D" value is 0.1 to 1 μm. The D value corresponds to a drift length for preventing a gate insulating layer breakdown voltage and a junction breakdown voltage by the drain voltage and is a value fixed by being optimized to a minimum extent. As the D value increases, a distance between the gate and the drain increases, and the breakdown voltage increases; however, the drain current may decrease.

As stated above, the "G" value corresponds to the length of the gate overlapped with the gate insulating layer 14. In one example, the G value is approximately 0.1 to 1.0 μm. The most important "B" value is the length of the extended drain junction region that overlaps with the gate, and corresponds to approximately 0.1 to 1 μm in the example.

Figure 14:
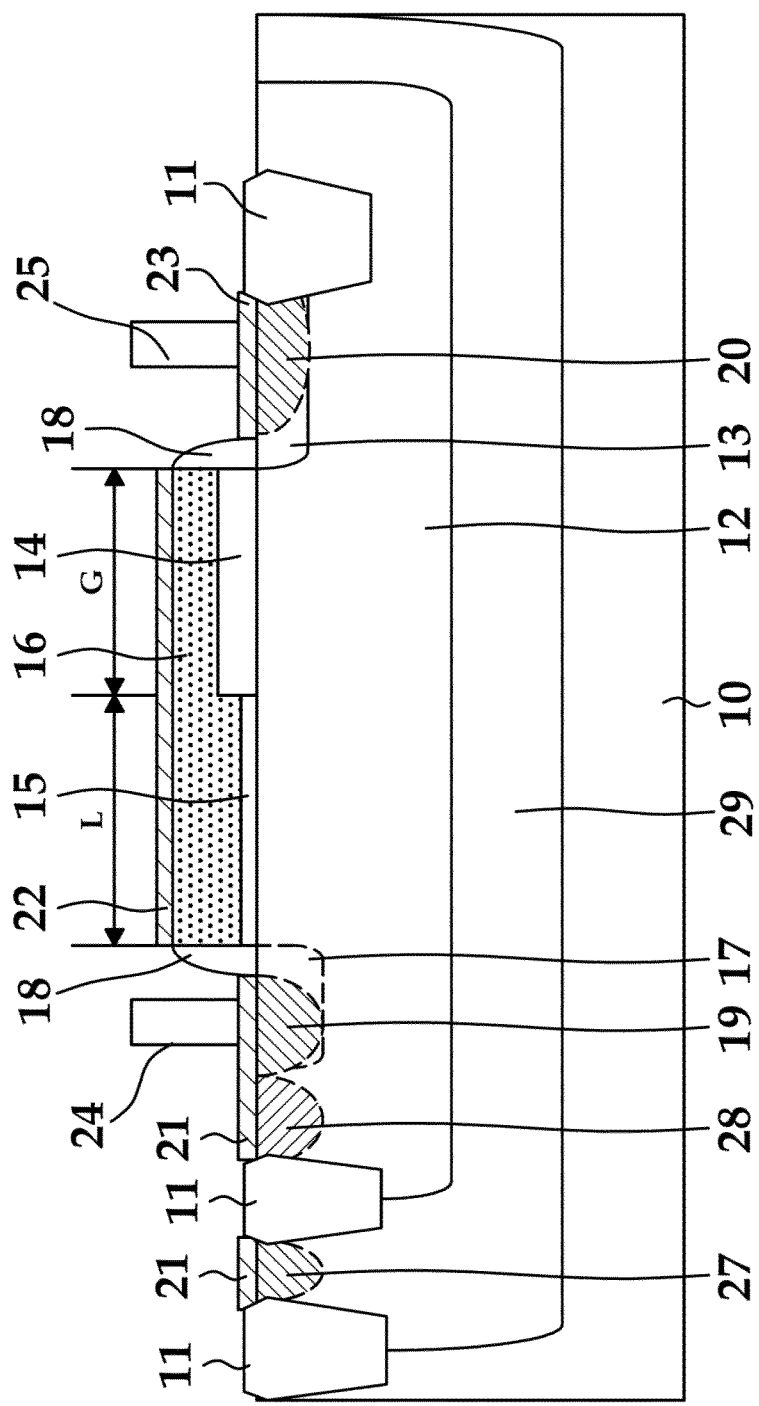
FIGS. 14 and 15 illustrate cross-sectional views of examples of stepped gate insulating layer DMOS device in which an extended drain junction region does not overlap with a gate insulating layer or the gate electrode.
Figure 15:
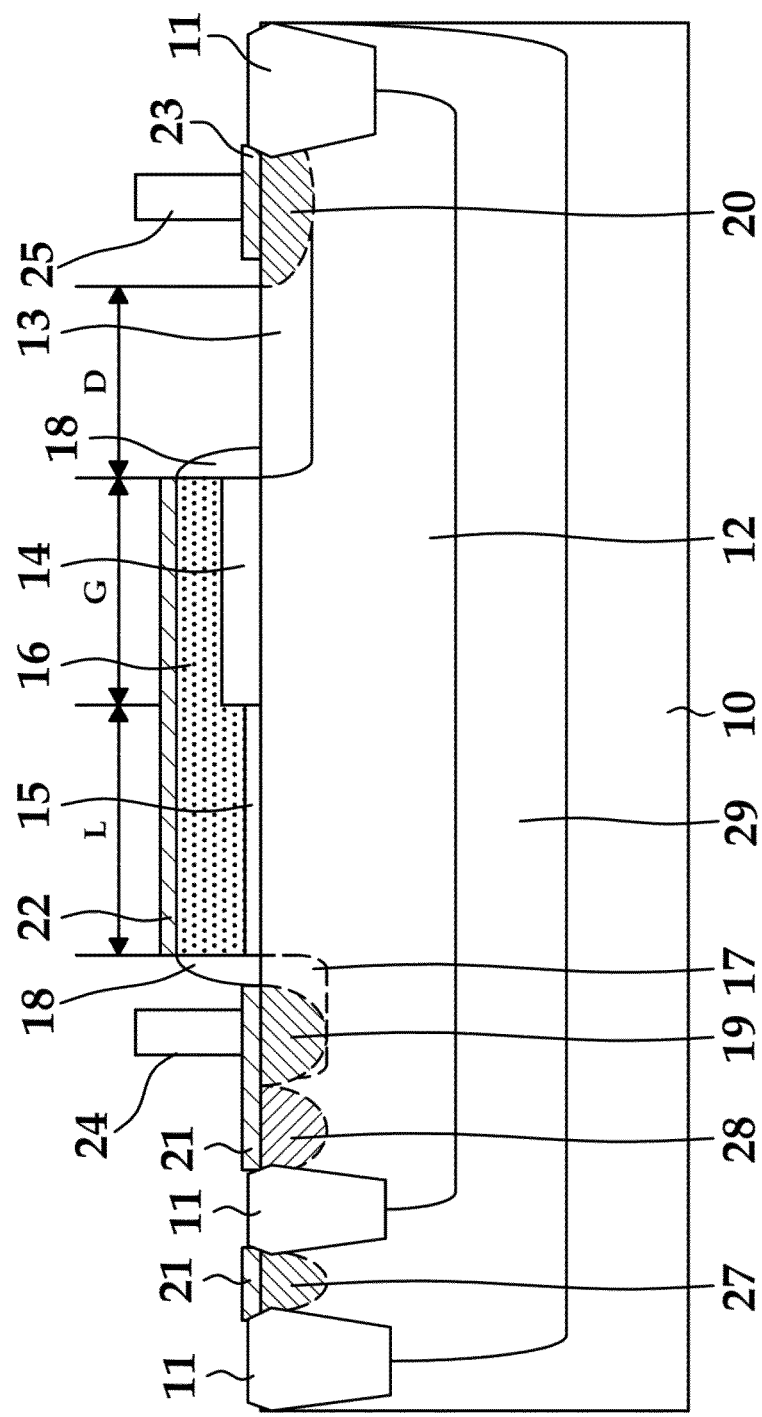

FIGS. 14 and 15 illustrate examples in which the extended drain junction region 13 stated above is not overlapped with the gate insulating layers 14 and 15 or the gate electrode 16. FIG. 14 illustrates an example in which the drain region 20 is formed directly next to the gate spacer 18. Further, the extended drain junction region 13 surrounds the drain region 20 and extends only under the gate spacer 18.

In contrast, FIG. 15 illustrates an example in which the drain region 20 is formed with the length "D" from the gate spacer 18 without being formed directly next to the gate spacer. In addition, the extended drain junction region 13 surrounds the drain region 20 and extends only under the gate spacer 18. In the aforementioned two examples, a desired breakdown voltage can be obtained up to some extent, but a target threshold voltage (0.3 to 1.0 V) for having a desired drain current is not obtained as much as the aforementioned examples illustrated in FIGS. 10 and 11.

Figure 16:
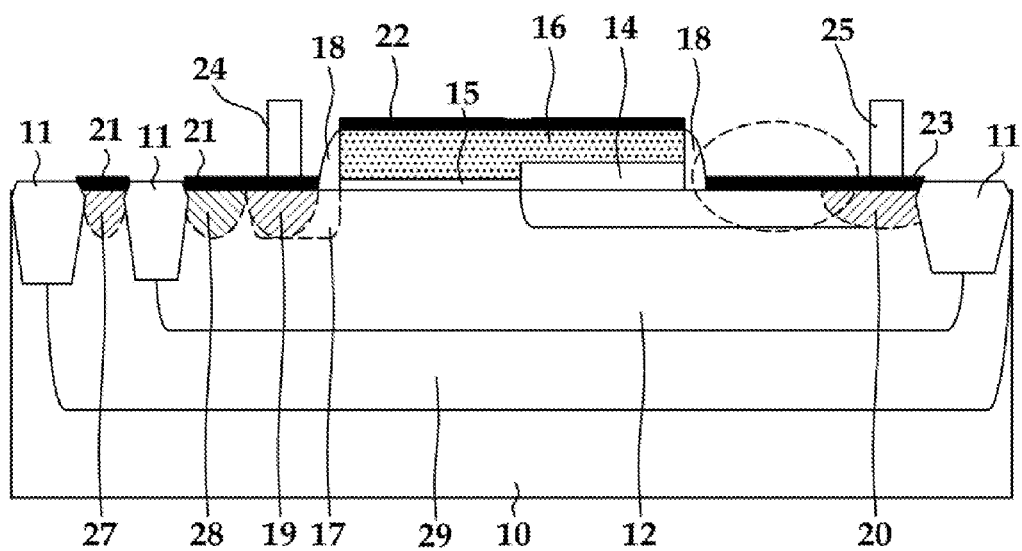
FIG. 16 illustrates a cross-sectional view of an example of a stepped gate insulating layer DMOS device in which silicides formed on a drain region extend to a gate insulating layer region.

FIG. 16 illustrates a cross-sectional view of a stepped gate insulating layer DMOS device according to another example of the present disclosure. In this example, the silicide 23 on the drain region 20 may extend to the second gate insulating layer 14 as indicated by a circle dotted line. In this case, the extended drain junction region 13 extends laterally to a location vertically under a thick gate insulation layer 14.

Referring to FIG. 16, the drifted region D illustrated in FIG. 15 set to prevent the gate insulating layer breakdown voltage and the junction breakdown voltage is removed in the illustrated device. In addition, in this example, a contact space with respect to a minimum electrode may be implemented to be equal to the source region, so that there is an effect of reducing a design rule.

Figure 17:
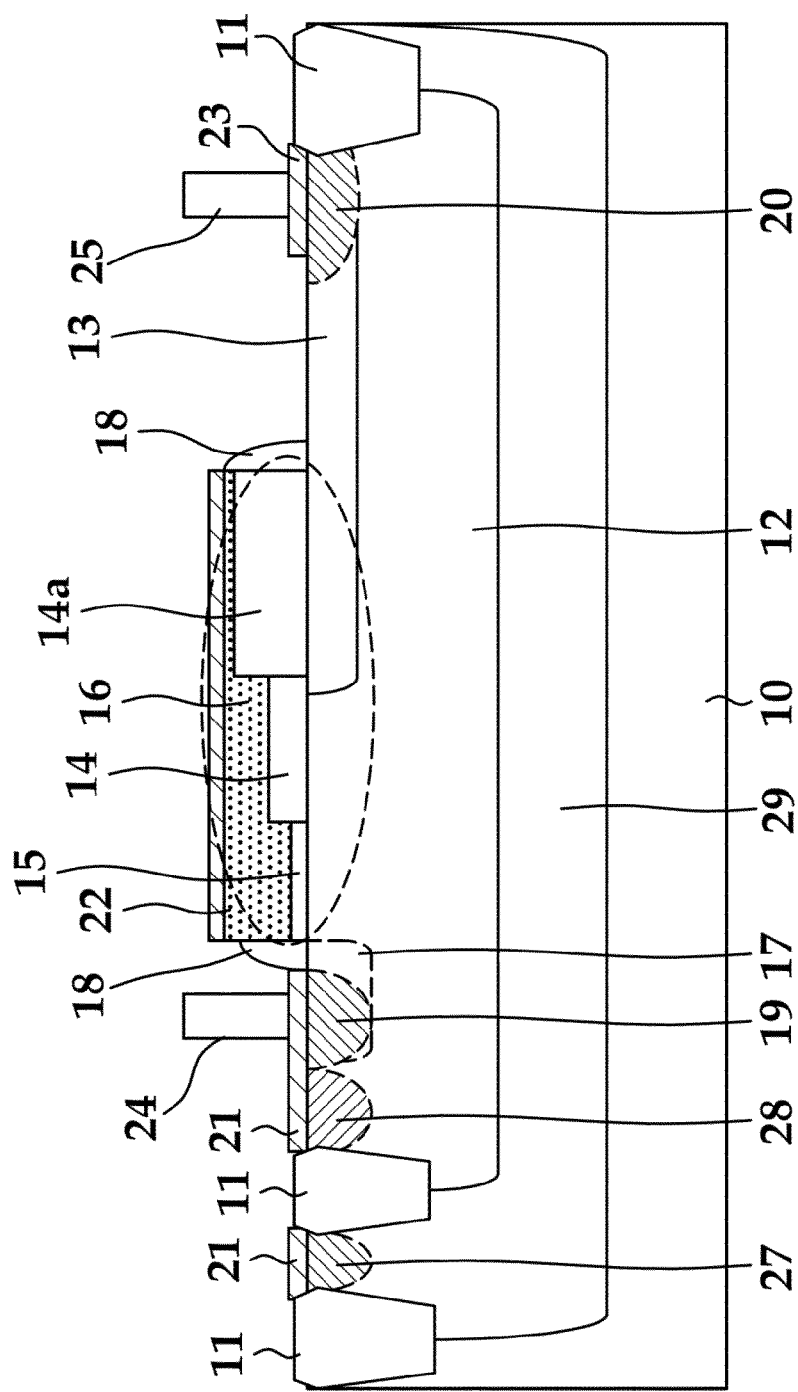
FIG. 17 illustrates a cross-sectional view of an example of a stepped gate insulating layer DMOS device including first to third insulating layers.

FIG. 17 illustrates a cross-sectional view of a stepped gate insulating layer DMOS device including first to third gate insulating layers 14, 14a, and 15 according to an example of the present disclosure. In this example, a third gate insulting layer 14a having a thickness that is greater than the thickness of the second gate insulating layer 14 is formed on the extended drain junction region 13.

Accordingly, three gate insulating layers 14, 14a, and 15 having different heights from each other are formed under the gate electrode 16, and the extended drain junction region 13 extends from the drain region 20 to the second and third gate insulating layers 14 and 14a. By forming gate insulating layers of three different thicknesses, the device can be selectively operated as the LV, MV or HV device, so that drivability of the drain current for the gate voltage is increased. Accordingly, it is possible to supply the high drain current even in the low-voltage gate input voltage as compared to the medium-voltage device (the MV device) or the high-voltage device (the HV device), and a size of the device need not be increased to accommodate individual devices for different voltage levels.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
a substrate;
a well region of a first conductivity type disposed in the substrate;
an extended drain junction region disposed in the well region of a first conductivity type;
a source region disposed in the well region;
a drain region disposed in the extended drain junction region;
a shallow trench isolation region disposed adjacent to the drain region; and
a stepped gate oxide layer disposed on the extended drain junction region comprising a thin gate insulating layer and a thick gate insulating layer, the thick gate insulating layer being disposed closer to the drain region than the thin gate insulating layer;
a gate electrode disposed above the stepped gate oxide layer;
wherein the gate electrode is positioned to overlap an entire length of the thick gate insulating layer that overlaps the extended drain junction region,
wherein the extended drain junction region overlaps with a portion of the thick gate insulating layer and a portion of the thin gate insulating layer,
wherein the extended drain junction region extends laterally to a portion of the well region from the drain region, and
wherein the well region of the first conductivity type is disposed to have a depth deeper than a depth of the shallow trench isolation region.

2. The semiconductor device according to claim 1, wherein the drain region and the source region are second conductivity regions, and the extended drain junction region is a second conductivity region.

3. The semiconductor device according to claim 1, wherein a length of the extended drain junction region overlapping with the gate electrode is greater than a length of the gate electrode overlapping with the thick gate insulating layer.

4. The semiconductor device according to claim 3, wherein a difference between the length of the gate electrode overlapping with the thick gate insulating layer and the length of the extended drain junction region overlapping with the gate electrode is equal to or less than 0.1 µm.

5. The semiconductor device according to claim 1, wherein the extended drain junction region has a depth of 500 Å to 3500 Å.

6. The semiconductor device according to claim 1, wherein the shallow trench isolation region has a depth deeper than the extended drain junction region.

7. The semiconductor device according to claim 1, wherein the extended drain junction region extends to a portion of the well region under the thin gate insulating layer.

8. The semiconductor device according to claim 1, wherein the drain region is formed in the extended drain junction region and is isolated from the source region by the well region.

9. The semiconductor device according to claim 1, further comprising a second conductive type medium well region between the extended drain junction region and the drain region.

10. The semiconductor device according to claim 1, wherein the extended drain junction region contacts the well region.

11. The semiconductor device according to claim 1, wherein the thick gate insulating layer is not a LOCOS oxide layer.

12. The semiconductor device according to claim 1, wherein an upper surface of a semiconductor region between the gate insulating layer and the drain region is coplanar.

13. The semiconductor device according to claim 1, wherein a sidewall of the gate electrode facing the drain region is aligned with a sidewall of the thick gate insulating layer.

14. The semiconductor device according to claim 1, wherein the well region of the first conductivity type surrounds the extended drain region and the drain region.

15. The semiconductor device according to claim 1, further comprising a deep well region of a second conductivity type disposed in the substrate, and
wherein the well region of the first conductivity type and the extended drain region is disposed in the deep well region.

16. The semiconductor device according to claim 1, further comprising a second shallow trench isolation region disposed adjacent to the source region, wherein the depth of the well region of the first conductivity type is deeper than a depth of the second shallow trench isolation region.

17. A semiconductor device comprising:
a substrate;
a deep well region of a first conductivity type disposed in the substrate;
a well region of the first conductivity type disposed in the deep well region;
an extended drain junction region disposed in the deep well region;
a source region disposed in the well region;
a drain region disposed in the extended drain junction region;
a stepped gate oxide layer disposed on the extended drain junction region comprising a thin gate insulating layer and a thick gate insulating layer, the thick gate insulating layer being disposed closer to the drain region than the thin gate insulating layer, a lower surface of the thin gate insulating layer being coplanar to a lower surface of the thick gate insulating layer; and
a gate electrode disposed above the stepped gate oxide layer,
wherein the gate electrode overlaps a portion of the thick gate insulating layer nearer to the drain region than to the source region, and
wherein the extended drain junction region overlaps with a portion of the thin gate insulating layer.

18. The semiconductor device according to claim 17, further comprising a shallow trench isolation region disposed adjacent to the drain region, wherein the deep well region of the first conductivity type has a depth deeper than a depth of the shallow trench isolation region.

19. The semiconductor device according to claim 18, further comprising a second shallow trench isolation region disposed adjacent to the source region, wherein the depth of the deep well region of the first conductivity type is deeper than a depth of the second shallow trench isolation region.

20. The semiconductor device according to claim 17, further comprising a shallow trench isolation region disposed adjacent to the drain region, wherein the well region of the first conductivity type has a depth deeper than a depth of the shallow trench isolation region.

21. The semiconductor device according to claim 17, further comprising a deep well contact region of the first conductivity type disposed in the deep well region.

22. The semiconductor device according to claim 17, wherein the well region of the first conductivity type surrounds the source region and does not extend to the thick gate insulating layer.

23. The semiconductor device according to claim 17, wherein the well region of the first conductivity type interfaces with the extended drain region under the thin gate insulating layer.

24. The semiconductor device according to claim 23, wherein the well region of the first conductivity type does not interface with the extended drain region under the thick gate insulating layer.

25. A semiconductor device comprising:
   a substrate;
   a well region of a first conductivity type disposed in the substrate;
   an extended drain junction region disposed in the well region of a first conductivity type;
   a source region disposed in the well region;
   a drain region disposed in the extended drain junction region;
   a stepped gate oxide layer disposed on the extended drain junction region comprising a thin gate insulating layer and a thick gate insulating layer, the thick gate insulating layer being disposed closer to the drain region than the thin gate insulating layer, and a lower surface of the thin gate insulating layer being coplanar to a lower surface of the thick gate insulating layer;
   a gate electrode disposed above the stepped gate oxide layer and disposed continuously above at least half of a length of the thick gate insulating layer; and
   wherein the extended drain junction region overlaps with a portion of the thin gate insulating layer,
   wherein a length of the extended drain junction region overlapping with the thick gate insulating layer is greater than a length of the extended drain junction region overlapping with the thin gate insulating layer.

* * * * *

UNITED STATES PATENT AND TRADEMARK OFFICE
CERTIFICATE OF CORRECTION

PATENT NO.        : 9,595,590 B2                           Page 1 of 1
APPLICATION NO.   : 14/230456
DATED             : March 14, 2017
INVENTOR(S)       : Yu Shin Ryu et al.

It is certified that error appears in the above-identified patent and that said Letters Patent is hereby corrected as shown below:

On the Title Page

Item (72) Inventors should be corrected to read:
Yu Shin Ryu, Daejeon-si (KR); Bo
Seok Oh, Cheongju-si (KR); Jin
Yeong Son, Cheongju-si (KR)

Signed and Sealed this
Twenty-third Day of May, 2017

Michelle K. Lee
*Director of the United States Patent and Trademark Office*